United States Patent
Shin et al.

(10) Patent No.: US 9,647,033 B2
(45) Date of Patent: May 9, 2017

(54) METHODS OF MANUFACTURING MAGNETIC MEMORY DEVICE HAVING A MAGNETIC TUNNEL JUNCTION PATTERN

(71) Applicants: Hye Min Shin, Suwon-si (KR); Jun Ho Park, Suwon-si (KR); Dae Eun Jeong, Yongin-si (KR)

(72) Inventors: Hye Min Shin, Suwon-si (KR); Jun Ho Park, Suwon-si (KR); Dae Eun Jeong, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/965,386

(22) Filed: Dec. 10, 2015

(65) Prior Publication Data
US 2016/0181509 A1    Jun. 23, 2016

(30) Foreign Application Priority Data

Dec. 22, 2014  (KR) .................... 10-2014-0186234

(51) Int. Cl.
*H01L 27/22* (2006.01)
*H01L 43/12* (2006.01)

(52) U.S. Cl.
CPC ............ *H01L 27/228* (2013.01); *H01L 43/12* (2013.01)

(58) Field of Classification Search
CPC .......... H01L 43/02; H01L 43/08; H01L 43/12; H01L 27/228
See application file for complete search history.

(56) References Cited

U.S. PATENT DOCUMENTS

| 6,806,096 | B1 | 10/2004 | Kim et al. |
| 7,211,849 | B2 | 5/2007 | Hineman et al. |
| 8,043,732 | B2 | 10/2011 | Anderson et al. |
| 8,138,562 | B2 | 3/2012 | Mao |
| 8,574,928 | B2* | 11/2013 | Satoh ............... H01L 27/222 438/3 |
| 8,590,139 | B2 | 11/2013 | Op De Beeck et al. |
| 2008/0001241 | A1* | 1/2008 | Tuckerman ......... H01L 31/0203 257/434 |

(Continued)

FOREIGN PATENT DOCUMENTS

| KR | 20030000722 A | 1/2003 |
| KR | 20090002616 A | 1/2009 |
| KR | 20140081168 A | 7/2014 |

*Primary Examiner* — Charles Garber
*Assistant Examiner* — Brigitte Paterson
(74) *Attorney, Agent, or Firm* — Harness, Dickey & Pierce, PLC

(57) ABSTRACT

Methods of manufacturing a magnetic memory device including forming a lower magnetic layer, a tunnel barrier layer, and an upper magnetic layer on a substrate, forming a magnetic tunnel junction (MTJ) pattern by patterning the lower magnetic layer, the tunnel barrier layer, and the upper magnetic layer, forming a first insulating layer exposing an upper surface of the MTJ pattern, forming a polymer pattern on the exposed upper surface of the MTJ pattern, forming a second insulating layer exposing an upper surface of the polymer pattern, removing the polymer pattern to form a cavity in the second insulating layer, the cavity exposing the upper surface of the MTJ pattern, and forming a metal line by filling the cavity with a conductive metal.

11 Claims, 24 Drawing Sheets

(56) References Cited

U.S. PATENT DOCUMENTS

| | | | |
|---|---|---|---|
| 2009/0026621 A1* | 1/2009 | Poddar | H01L 24/03 |
| | | | 257/760 |
| 2011/0210430 A1* | 9/2011 | Trivedi | H01L 23/585 |
| | | | 257/664 |
| 2014/0120635 A1* | 5/2014 | Nishimura | H01L 43/12 |
| | | | 438/3 |
| 2014/0159148 A1* | 6/2014 | Chung | H01L 27/10814 |
| | | | 257/330 |

* cited by examiner

METHODS OF MANUFACTURING MAGNETIC MEMORY DEVICE HAVING A MAGNETIC TUNNEL JUNCTION PATTERN

CROSS-REFERENCE TO RELATED APPLICATION

This application claims the priority and benefit, under 35 U.S.C. §119, of Korean Patent Application No. 10-2014-0186234 filed on Dec. 22, 2014, in the Korean Intellectual Property Office, the disclosure of which is incorporated herein by reference.

BACKGROUND

Field

Example embodiments of present inventive concepts relate to methods of manufacturing a magnetic memory device.

Related Art

A magnetic memory device is a nonvolatile memory device from which data can be read and to which data can be written using a magnetic tunnel junction pattern including two magnetic materials and an insulating layer interposed therebetween. A resistance value of the magnetic tunnel junction pattern may vary according to directions in which the two magnetic materials are magnetized, and in this regard, data may be written thereon or erased therefrom using a difference in resistance values. A magnetic memory device using the phenomenon of spin transfer torque (STT) uses a scheme of varying a magnetization direction of a magnetic material according to spin transfer of electrons when a spin-polarized current is applied to a magnetic material in a single direction.

SUMMARY

Example embodiments of the present inventive concepts relate to methods of manufacturing a magnetic memory device.

Example embodiments of the present inventive concepts provide a magnetic memory device having improved magnetic tunnel characteristics and a manufacturing method thereof.

According to example embodiments of the present inventive concepts, a method of manufacturing a magnetic memory device includes forming a lower magnetic layer, a tunnel barrier layer, and an upper magnetic layer on a substrate, forming a magnetic tunnel junction (MTJ) pattern by patterning the lower magnetic layer, the tunnel barrier layer, and the upper magnetic layer, forming a first insulating layer exposing an upper surface of the MTJ pattern, forming a polymer pattern on the exposed upper surface of the MTJ pattern, forming a second insulating layer exposing an upper surface of the polymer pattern, removing the polymer pattern to form a cavity in the second insulating layer, the cavity exposing the upper surface of the MTJ pattern, and forming a metal line by filling the cavity with a conductive metal.

The forming of the first insulating layer may include covering side surfaces of the tunnel barrier layer and side surfaces of the lower magnetic layer with the first insulating layer.

The forming of the polymer pattern may include forming a polymer layer on the exposed upper surface of the MTJ pattern and the first insulating layer; forming a mask pattern on an upper surface of the polymer layer; and patterning the polymer layer using the mask pattern as a mask.

The method may further include forming an SiN layer on the exposed upper surface of the MTJ pattern and the first insulating layer, before the forming of the polymer layer.

The method may further include performing planarization until an upper surface of the metal line and an upper surface of the second insulating layer are coplanar, after the forming of the metal line.

The method may further include removing a portion of the second insulating layer such that an area of an uppermost portion of the cavity is greater than an area of a lowermost portion of the cavity, after the removing of the polymer pattern.

The removing of the polymer pattern includes covering side surfaces of the tunnel barrier layer and side surfaces of the lower magnetic layer with the first insulating layer.

The removing of the polymer pattern may include performing an asking process.

The forming of the polymer pattern may include forming a spin-on-hardmask (SOH).

The method may further include providing an upper electrode on the upper magnetic layer.

A thickness of the upper electrode may range from about 10 Å to about 200 Å.

An angle between a side surface of the MTJ pattern and an upper surface of the substrate may range from about 60 degrees to about 80 degrees.

According to example embodiments of the present inventive concepts, a method of manufacturing a magnetic memory device includes forming a lower magnetic layer, a tunnel barrier layer, and an upper magnetic layer on a substrate; patterning the lower magnetic layer, the tunnel barrier layer, and the upper magnetic layer, forming a polymer pattern having a width greater than a width of an upper surface of the upper magnetic layer on the upper surface of the upper magnetic layer, forming a lower insulating layer covering the entirety of the polymer pattern, removing a portion of the lower insulating layer to expose an upper surface of the polymer pattern, removing the polymer pattern to form a first cavity in the lower insulating layer, the first cavity exposing the upper surface of the upper magnetic layer, and forming an upper electrode by filling the first cavity with a first conductive metal.

The removing of the polymer pattern may include performing an asking process.

The method may further include forming an upper insulating layer on the upper electrode, forming a mask pattern on an upper surface of the upper insulating layer, etching the upper insulating layer, using the mask pattern as an etching mask, to form a second cavity in the upper insulating layer, the second cavity exposing an upper surface of the upper electrode, and forming a metal line by filling the second cavity with a second conductive metal.

According to example embodiments, a method of manufacturing a magnetic memory device includes providing a magnetic tunnel junction (MTJ) pattern including at least two magnetic patterns, and a tunnel barrier pattern between the at least two magnetic patterns; forming a polymer pattern on an upper surface of the MTJ pattern, wherein the polymer pattern is within an insulating layer; reducing a height of the polymer pattern within the insulating layer; removing the polymer pattern to expose an upper surface of the MTJ pattern through the insulating layer; and forming an upper electrode on the upper surface of the MTJ pattern.

A thickness of the upper electrode may be equal to or less than about 200 Å.

The removing of the polymer pattern may include performing an asking process.

A slope of side surfaces of the MTJ pattern before the removing of the polymer pattern may remain the same after the removing of the polymer pattern.

The removing of the polymer pattern may include removing the insulating layer, and the forming of the upper electrode may include covering an entirety of the MTJ pattern with the upper electrode.

BRIEF DESCRIPTION OF DRAWINGS

Example embodiments will be more clearly understood from the following detailed description taken in conjunction with the accompanying drawings. FIGS. 1-8 represent non-limiting, example embodiments as described herein.

FIG. 1 is a circuit diagram illustrating a cell array of a magnetic memory device according to example embodiments of the present inventive concepts;

FIG. 2 is a plan view of the magnetic memory device according to example embodiments of the present inventive concepts;

FIG. 3 is a cross-sectional view of the magnetic memory device according to example embodiments of the present inventive concepts, taken along lines I-I' and II-II' of FIG. 2;

FIG. 5 is a cross-sectional view of the magnetic memory device according to example embodiments of the present inventive concepts, taken along lines I-I' and II-II' of FIG. 2;

FIGS. 7 and 8 are block diagrams illustrating an electronic device including a magnetic memory device according to example embodiments of the present inventive concepts.

DETAILED DESCRIPTION

Figure 1:
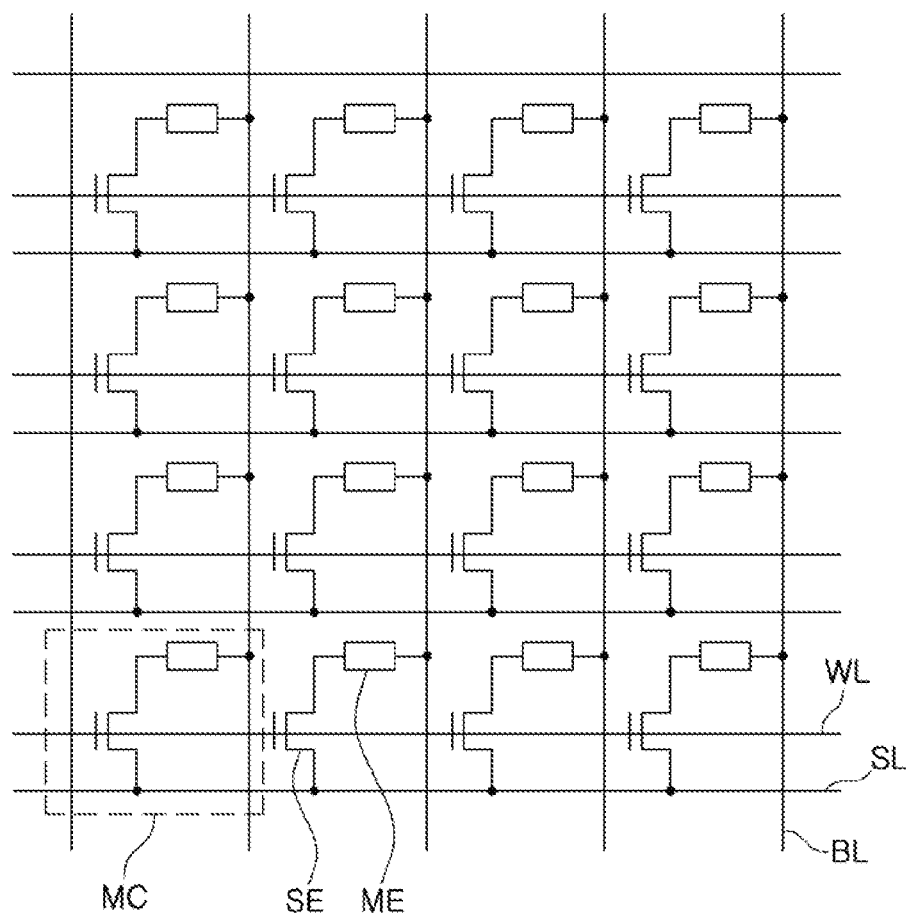

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various features will be described in detail with reference to the attached drawings. However, example embodiments described are not limited thereto.

Example embodiments of the present inventive concepts relate to methods of manufacturing a magnetic memory device.

FIG. 1 is a circuit diagram illustrating a cell array of a magnetic memory device according to example embodiments of the present inventive concepts.

Referring to FIG. 1, an array cell of a magnetic memory device includes a plurality of unit cells MC arranged in a matrix form. Each of the plurality of unit cells MC of the magnetic memory device includes a select element (SE) and a magnetic memory element (ME). The plurality of unit cells MC of the magnetic memory device are electrically connected to a word line and a bit line. Also, as illustrated in FIG. 1, in the case that select element (SE) is a transistor, the plurality of unit cells MC of the magnetic memory device may further include a source line SL electrically connected to a source region of the select element (SE). The word line (WL) and the bit line (BL) may be arranged at a set (or predetermined) angle, for example, to be perpendicular to each other two-dimensionally. Also, the word line (WL) and the source line SL may be arranged at a set (or predetermined) angle, for example, to be parallel.

The magnetic memory element ME may include a magnetic tunnel junction (MTJ). Also, the magnetic memory element ME may serve as a memory using a spin torque transfer (STT) phenomenon in which a magnetization direction of a magnet is varied by an input current. The select element (SE) may be configured to selectively control a flow of electric charges passing through the magnetic tunnel junction (MTJ). For example, the select element (SE) may be one of a diode, a PNP bipolar transistor, an NPN bipolar transistor, an NMOS field effect transistor, and a PMOS field effect transistor.

Figure 2:
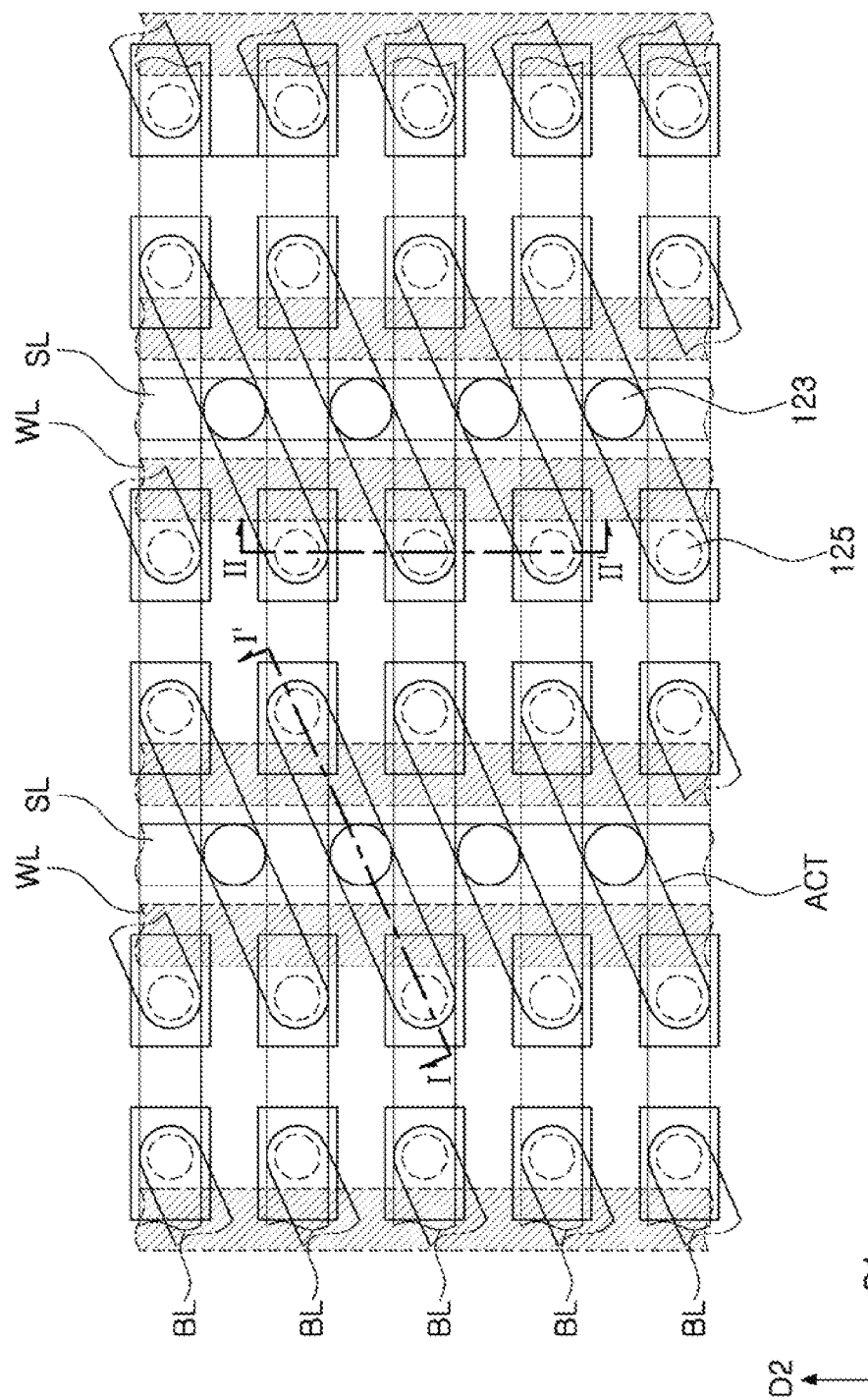
Figure 3:
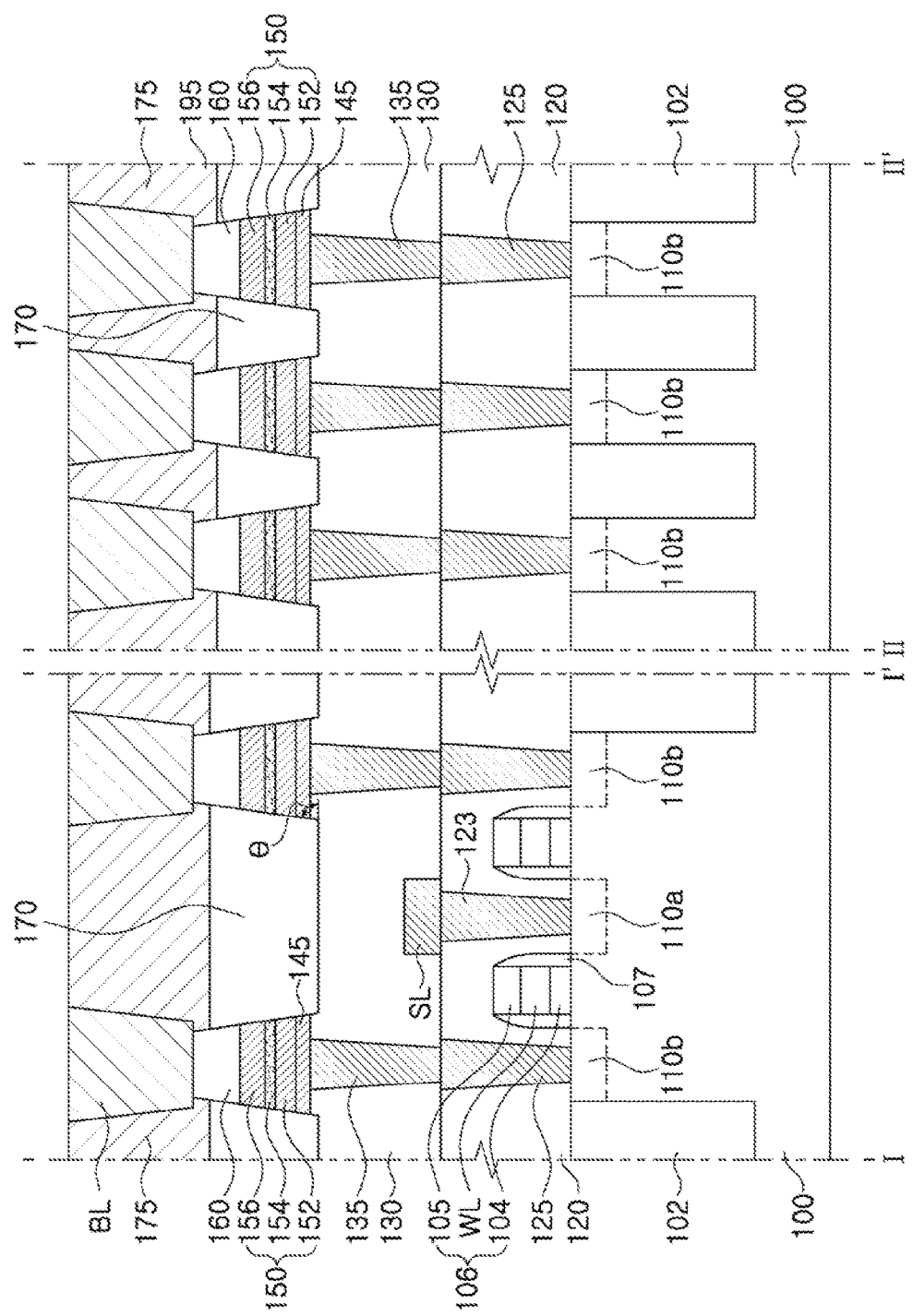

FIG. 2 is a plan view of a magnetic memory device according to example embodiments the present inventive concepts. FIG. 3 is a cross-sectional view of the magnetic memory device according to example embodiments of the present inventive concepts, taken along lines I-I' and II-II' of FIG. 2.

Referring to FIGS. 2 and 3, isolation patterns 102 defining active patterns ACT may be formed on a substrate 100. The substrate 100 may be a silicon substrate, a germanium substrate, and/or a silicon-germanium substrate.

The active patterns ACT may be arranged two-dimensionally in a plurality of rows and a plurality of columns, and each of the active patterns ACT may have a rectangular shape (or a bar shape) extending in a diagonal direction with respect to first and second directions D1 and D2, perpendicular to each other. The active patterns ACT may be arranged in the first direction D1 to form each row, and arranged in the second direction D2 to form each column. The active patterns ACT may be doped with a first conductivity-type dopant.

A gate 106 including a word line (WL) may be disposed on the substrate 100. The gate 106 includes a gate insulating layer pattern 104, the word line (WL), and a gate mask 105. A spacer 107 may be disposed on side walls of the gate 106.

A first impurity region 110a and a second impurity region 110b may be formed in regions adjacent to the gate 106 on the substrate 100.

A first interlayer insulating layer 120 may be disposed on the entire surface of the substrate 100. The first interlayer insulating layer 120 may be formed of an oxide (for example, a silicon oxide). First and second contact plugs 123 and 125 may penetrate through the first interlayer insulating layer 120. The first contact plug 123 may be electrically connected to the first impurity region 110a. The second contact plugs 125 may be electrically connected to the second impurity regions 110b.

The first and second contact plugs 123 and 125 may include at least one among a semiconductor material doped with a dopant (for example, doped silicon, or the like), a metal (for example, tungsten, aluminum, titanium, and/or tantalum), a conductive metal nitride (for example, a titanium nitride, a tantalum nitride, and/or a tungsten nitride), and a metal-semiconductor compound (for example, a metal silicide).

Source lines SL extending in the first direction D1 may be disposed on the first interlayer insulating layer 120. The source lines SL may be disposed to traverse the word lines WL. The source lines SL may be connected to the first contact plug 123 arranged in the first direction D1.

A second interlayer insulating layer 130 may be disposed on the first interlayer insulating layer 120, and the second interlayer insulating layer 130 may cover the second contact plugs 125 and the source lines SL.

Lower contacts 135 may be disposed to penetrate through the second interlayer insulating layer 130, and the lower contacts 135 may be electrically connected to the second contact plugs 125, individually. In example embodiments, the lower contacts 135 may be arranged to be spaced apart from one another in the first direction D1 and the second direction D2 in a planar manner. The lower contacts 135 may be arranged in a zigzag form in the planar manner.

Lower electrodes 145 may be disposed on the lower contacts 135. The lower electrodes 145 may include a conductive material such as titanium, tantalum, ruthenium, a titanium nitride, a tantalum nitride, tungsten, and the like. These materials may be used alone or in combination. For example, the lower electrodes 145 may have a dual-layer structure such as ruthenium/titanium, ruthenium/tantalum, a ruthenium/titanium nitride, a ruthenium/tantalum nitride, or titanium nitride/tungsten.

A magnetic tunnel junction (MTJ) pattern 150 may be disposed on the lower electrode 145. The MTJ pattern 150 may include a lower magnetic layer 152 and a tunnel barrier layer 154 and an upper magnetic layer 156 sequentially disposed on the lower magnetic layer 152.

At least a portion of the lower electrode 145 may be patterned simultaneously when the MTJ pattern 150 is patterned.

In the present example embodiments, a perpendicular magnetic tunnel junction device in which the lower magnetic layer 152 serves as a pinned layer (or a fixed layer) and the upper magnetic layer 156 serves as a free layer will be described as an example, but alternatively, a perpendicular magnetic tunnel junction device in which the lower magnetic layer 152 serves as a free layer and the upper magnetic layer 156 serves as a pinned layer may also be formed.

The lower magnetic layer 152 may include an antiferromagnetic material layer. A magnetization direction of the antiferromagnetic material layer may be fixed as a direction substantially parallel to the substrate. The antiferromagnetic material layer may include, for example, a platinum-manganese (Pt—Mn) alloy, an iridium-manganese (Ir—Mn) alloy, a nickel-manganese (Ni—Mn) alloy, an iron-manganese (Fe—Mn) alloy and the like.

A ferromagnetic material layer may be disposed on the antiferromagnetic material layer of the lower magnetic layer 152. A magnetization direction of the ferromagnetic material layer may be fixed by the antiferromagnetic material layer. For example, the ferromagnetic material layer may include cobalt (Co), iron (Fe), platinum (Pt), palladium (Pd), and the like, and may have a synthetic antiferromagnet (SAF) structure. The SAF structure may be a multilayer structure in which a plurality of magnetic layers and at least one intermediate layer are sequentially stacked. For example, the SAF structure may be a multilayer structure in which a first magnetic layer, an intermediate layer, and a second magnetic layer are sequentially stacked. The SAF structure may be a multilayer structure in which a first magnetic layer, a first intermediate layer, a second magnetic layer, a second intermediate layer, and a third magnetic layer are sequentially stacked. For example, the first magnetic layer may include a Fe—Pt alloy, a Fe—Pd alloy, a Co—Pd alloy, a Co—Pt alloy, a Fe—Ni—Pt alloy, a Co—Fe—Pt alloy, a Co—Ni—Pt alloy, a Ni—Fe alloy, a Co—Fe alloy, a Ni—Fe—B alloy, a Co—Fe—B alloy, a Ni—Fe—Si—B alloy, a Co—Fe—Si—B alloy, and the like. The second and third magnetic layers may include a monolayer formed of cobalt (Co), iron (Fe), platinum (Pt), palladium (Pd), and the like, or multiple layers thereof, and the intermediate layer may include ruthenium (Ru), tantalum (Ta), chromium (Cr), copper (Cu), and the like.

The tunnel barrier layer 154 may be disposed on the lower magnetic layer 152. The tunnel barrier layer 154 may include any one selected from the group consisting of a magnesium oxide (MgO), an aluminum oxide ($Al_2O_3$), a silicon oxide ($SiO_2$), and a boron oxide ($B_2O_3$).

The upper magnetic layer 156 may be disposed on the tunnel barrier layer 154. The upper magnetic layer 156 may include at least one selected from the group consisting of iron (Fe), cobalt (Co), nickel (Ni), palladium (Pd), and platinum (Pt). For example, the upper magnetic layer 156 may include an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, and the like. In example embodiments, the upper magnetic layer 156 may include at least one selected from the group consisting of boron (B), carbon (C), copper (Cu), silver (Ag), gold (Au), and chromium (Cr).

The side surfaces of the MTJ pattern 150 may be sloped (or, inclined). The angle (θ) between the side surface of the MTJ pattern 150 and an upper surface of the substrate 100 may range from 60 degrees to 80 degrees, or about 60 degrees to about 80 degrees. The MTJ pattern 150 may have a trapezoidal shape.

An upper electrode 160 may be disposed on the MTJ pattern 150. The upper electrode 160 may include a monolayer formed of a conductive material such as titanium, tantalum, ruthenium, a titanium nitride, a tantalum nitride, tungsten, and the like, or multiple layers thereof.

A bit line (BL) 180 may be disposed on the MTJ pattern 150 and formed as a metal line in contact with the upper electrode 160. The bit line (BL) 180 may be formed of a metal having low resistivity, for example, copper (Cu). An upper portion of the bit line (BL) 180 may be greater than that of a lower portion thereof. The bit line (BL) 180 may have an inverted trapezoidal shape.

A first insulating layer 170 covering all the side surfaces of the MTJ pattern 150 and portions of side surfaces of the upper electrode 160 may be disposed on the second interlayer insulating layer 130. An upper surface of the upper electrode 160 may be higher than an upper surface of the first insulating layer 170.

A second insulating layer 175 covering all the side surfaces of the bit line (BL) 180 and portions of side surfaces of the upper electrode 160 may be disposed on the first insulating layer 170. An upper surface of the second insulating layer 175 and an upper surface of the bit line (BL) 180 may be coplanar.

The first and second interlayer insulating layers 120 and 130 and the first and second insulating layers 170 and 175 may be formed of a material which is not removed through an asking process and may include at least one selected from the group consisting of boro-phospho-silicate glass (BPSG), tonen silazene (TOSZ), undoped silicate glass (USG), spin-on glass (SOG), flowable oxide (FOX), tetraethyl orthosilicate (TEOS), and a high density plasma chemical vapor deposition (HDP-CVD) oxide, for example.

FIGS. 4A through 4J are cross-sectional views illustrating sequential processes of a method for manufacturing a magnetic memory device illustrated in FIG. 3 according to example embodiments of the present inventive concepts, taken along line I-I' of FIG. 2.

Figure 4A:
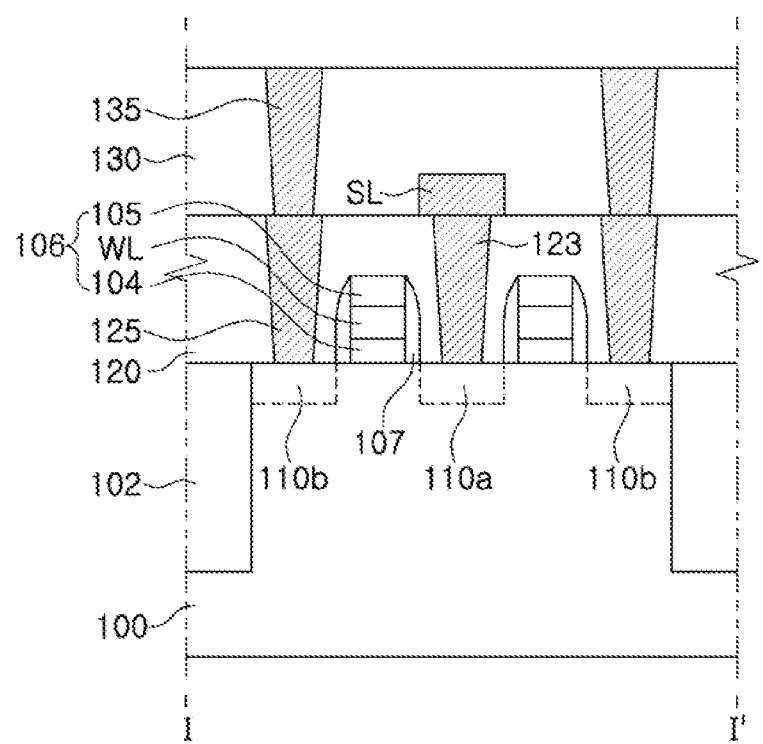
FIGS. 4A through 4J are cross-sectional views illustrating sequential processes of a method for manufacturing a magnetic memory device according to example embodiments of the present inventive concepts, taken along line I-I' of FIG. 2.

Referring to FIG. 4A, the isolation layer 102 is formed on the substrate 100. The isolation layer 102 may be formed through a shallow trench isolation (STI) process.

The gate insulating layer 104, the word line (WL) and the gate mask layer 105 are sequentially disposed on the substrate 100 and patterned though a photolithography process to form gates 106. The gate insulating layer 104 may be formed using a silicon oxide or a metal oxide. The word line (WL) may be formed using a doped polysilicon or metal. The gate mask layer 105 may be formed using a silicon nitride.

Thereafter, the first and second impurity regions 110a and 110b may be formed to be adjacent to the gates 106 through an ion implantation process using the gates 106 as ion implantation masks. The first and second impurity regions 110a and 110b may serve as source and drain regions of transistors including the gates 106.

The gate 106 and the first and second impurity regions 110a and 110b may constitute a transistor. The spacer 107 may be formed on side walls of the gate 106 using a silicon nitride.

Thereafter, the first interlayer insulating layer 120 covering the gate 106 and the spacer 107 may be formed on the substrate 100. The first interlayer insulating layer 120 may be partially etched to form first holes exposing the impurity regions 110a and 110b.

Thereafter, a first conductive layer filling the first holes is formed on the first interlayer insulating layer 120 and upper portions of the first conductive layer are removed through a chemical mechanical polishing (CMP) and/or etch-back process until the first interlayer insulating layer 120 is exposed, thereby forming the first contact plug 123 and the second contact plugs 125 in the first holes. The first contact plug 123 may be in contact with the first impurity region 110a and the second contact plugs 125 may be in contact with the second impurity regions 110b. The first conductive layer may be formed using a doped polysilicon, a metal, and the like. The first contact plug 123 may serve as a source line (SL) contact.

A second conductive layer in contact with the first contact plug 123 may be formed on the first interlayer insulating layer 120 and patterned to form a source line SL. The second conductive layer may be formed using a doped polysilicon, a metal, and the like. Thereafter, the second interlayer insulating layer 130 covering the source line SL may be formed on the first interlayer insulating layer 120. The second interlayer insulating layer 130 is partially etched to form second holes exposing the second contact plugs 125, and a third conductive layer embedding the second holes may be formed on the second contact plugs 125 and the second interlayer insulating layer 130. Upper portions of the third conductive layer are removed through a CMP and/or etch-back process until the second interlayer insulating layer 130 is exposed, thereby forming lower contacts 135 formed within the second holes.

Figure 4B:
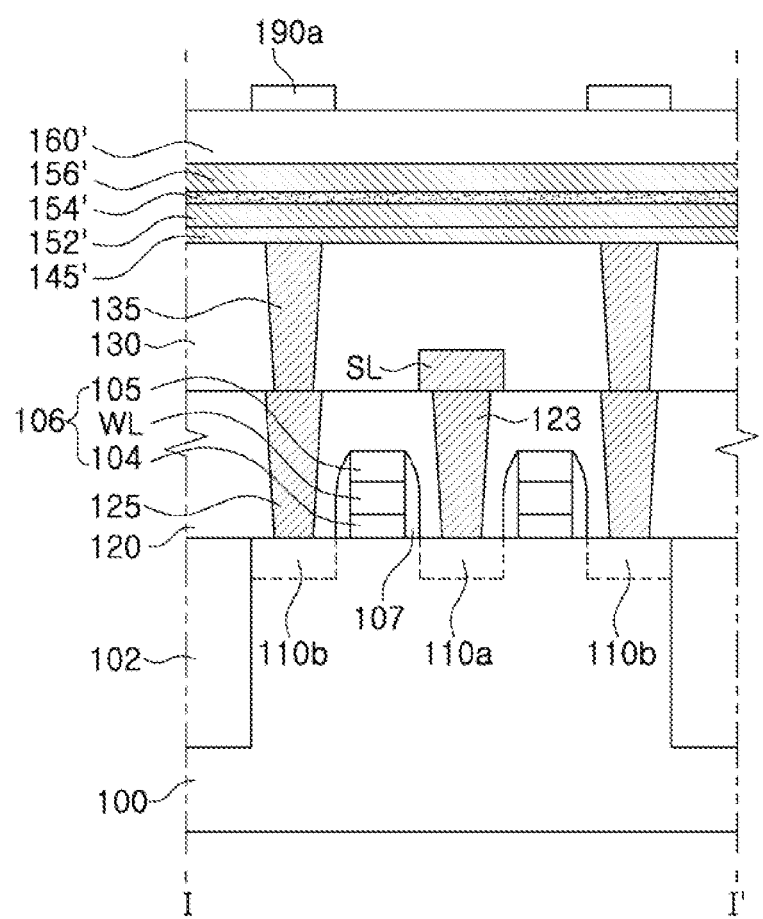

Referring to FIG. 4B, a lower electrode layer 145' may be formed on the second insulating layer 130 and the lower contacts 135. The lower electrode layer 145' may be formed through an atomic layer deposition (ALD) process, a chemical vapor deposition (CVD) process, and the like, using a conductive material such as titanium, tantalum, ruthenium, a titanium nitride, a tantalum nitride, or tungsten. For example, the lower electrode layer 145' may have a dual-layer structure such as ruthenium/titanium, ruthenium/tantalum, a ruthenium/titanium nitride, a ruthenium/tantalum nitride, or titanium nitride/tungsten.

A lower magnetic layer 152', a tunnel barrier layer 154', an upper magnetic layer 156', and an upper electrode layer 160' may be sequentially formed on the lower electrode layer 145'. The lower magnetic layer 152', the tunnel barrier layer 154', the upper magnetic layer 156', and the upper electrode layer 160' may be formed through a CVD process or an ALD process.

Mask patterns 190a may be formed on the upper electrode layer 160' such that the mask patterns 190a correspond to positions of the lower contacts 135. The mask patterns 190a may be photoresist patterns or may be hard mask patterns including a silicon oxide, a silicon nitride, and the like.

Figure 4C:
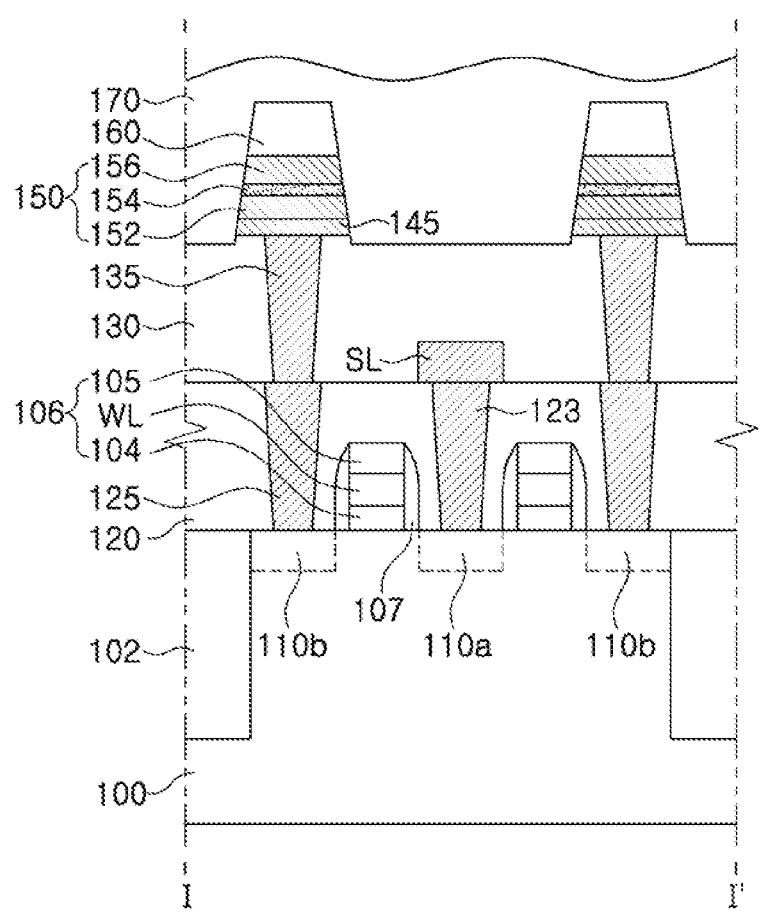

Referring to FIG. 4C, patterning may be performed using the mask patterns 190a as etching masks to form the MTJ pattern 150 including the lower magnetic layer 152, the tunnel barrier layer 154, and the upper magnetic layer 156, and the upper electrode 160. Here, at least a portion of the lower electrode 145 may be patterned. After the formation of the MTJ pattern 150, the first interlayer insulating layer 170 covering side surfaces of the lower electrode 145, the MTJ pattern 150, and the upper electrode 160 and an upper surface of the upper electrode 160 may be formed on the second interlayer insulating layer 130.

A thickness of the upper electrode 160 may range from 10 Å to 200 Å, or about 10 Å to about 200 Å. As the thickness of the upper electrode 160 is reduced, a distance between the bit line (BL) (please refer to FIG. 3) and the upper magnetic layer 156 may be reduced. In the case that upper magnetic layer 156 is a free layer, the efficiency of switching the magnetization direction of the free layer during a write process increases. In detail, in the case that thickness of the upper electrode 160 ranges from 10 Å to 200 Å (or about 10 Å to about 200 Å), the efficiency of switching the magnetization direction may increase.

The patterning may be performed through dry etching. In detail, the patterning may be performed through light element ion etching process or a light element ion plasma etching process. The light element ion etching process may be performed using at least one of hydrogen (H), helium (He), nitrogen (N), argon (Ar), and neon (Ne), for example. While the etching process is performed, the upper surface of the second interlayer insulating layer 130 exposed between the MTJ patterns 150 may be recessed.

Figure 4D:
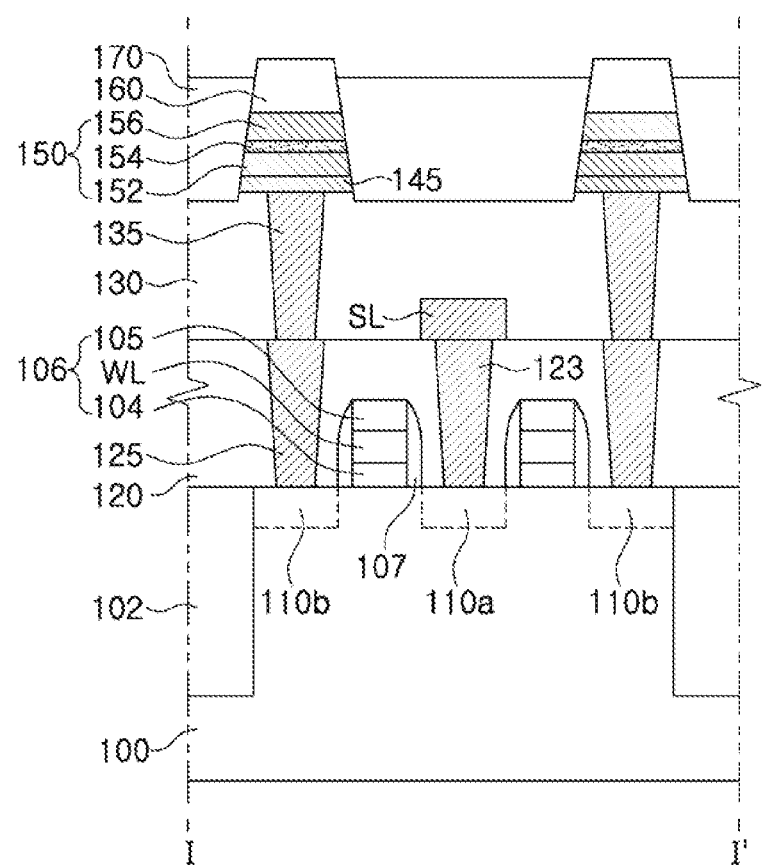

Referring to FIG. 4D, a portion of the first insulating layer 170 may be removed to expose an upper surface of the upper electrode 160. The portion of the first insulating layer 170 may be performed through an etch-back process. Here, the upper surface of the upper electrode 160 may protrude from the upper surface of the first insulating layer 170.

Figure 4E:
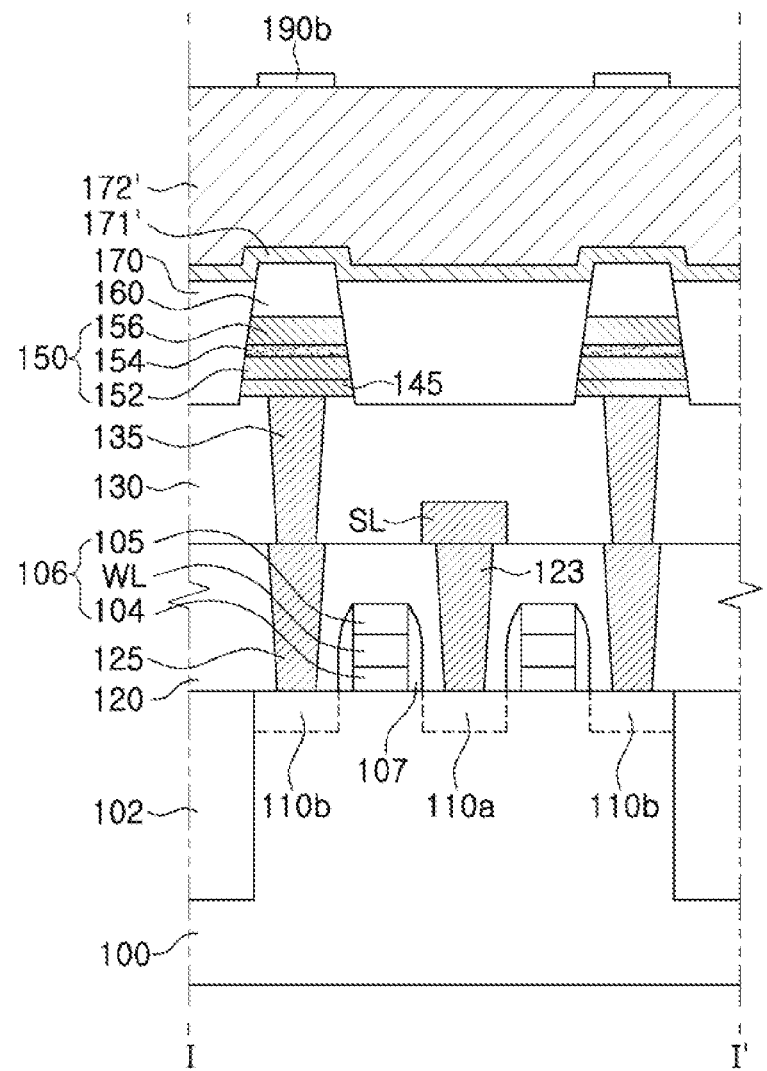

Referring to FIG. 4E, a silicon nitride (SiN) layer 171' covering all an upper surface of the first insulating layer 170, an upper surface of the upper electrode 160, and a protruded portion of the upper electrode 160 may be formed. A polymer layer 172' may be formed on the SiN layer 171'. Mask patterns 190b may be formed on the polymer layer 172' to correspond to the position of the upper electrode 160. The polymer layer 172' may be a spin-on-hardmask (SOH), and specifically, may be silicon (Si)—SOH or carbon (C)—SOH. The mask patterns 190b may be formed of the same material as that of the mask patterns 190a illustrated in FIG. 4B.

Figure 4F:
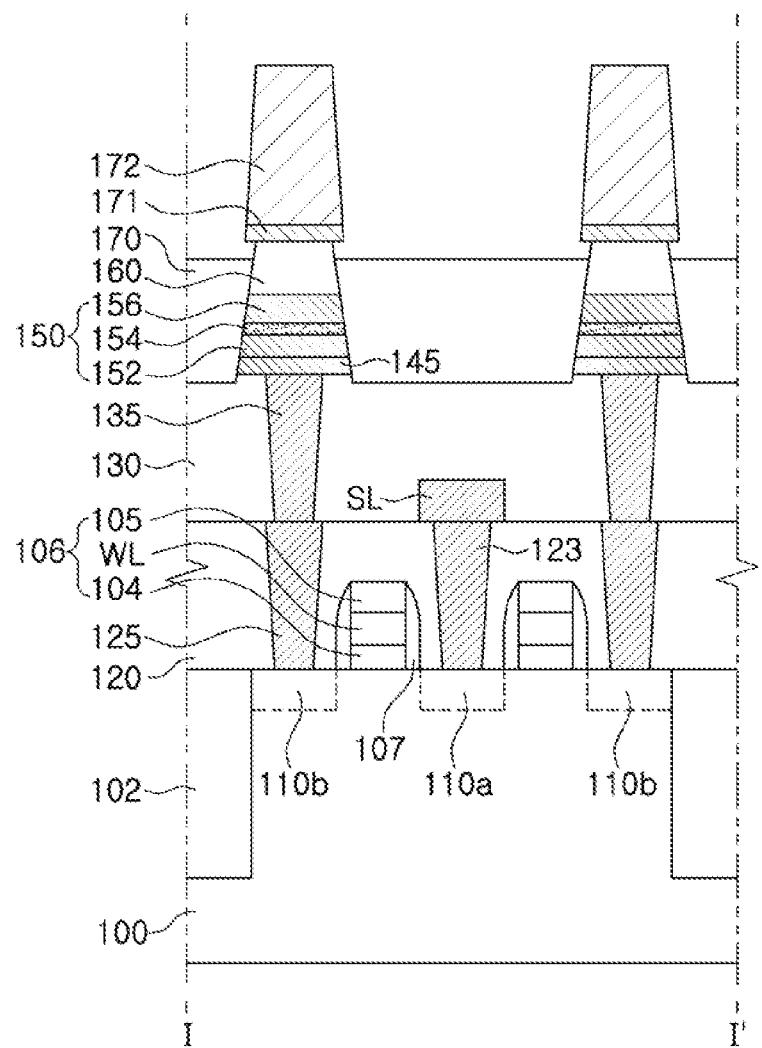

Referring to FIG. 4F, patterning is performed using the mask patterns 190b as etching masks to form an SiN pattern 171 and a polymer pattern 172. The SiN pattern 171 may allow the polymer pattern 172 having a narrow line width (critical dimension) and a high aspect ratio to stand on the upper electrode 160, without being collapsed. The patterning may be performed through dry etching. A width of an upper portion of the polymer pattern 172 may be narrower than that of a lower portion thereof. Because the polymer pattern 172 is formed through a process separate from the formation of the MTJ pattern 150, the polymer pattern 172 may have a narrow line width and high aspect ratio. This further facilitates manufacturing of a magnetic memory device having a fine pattern.

Figure 4G:
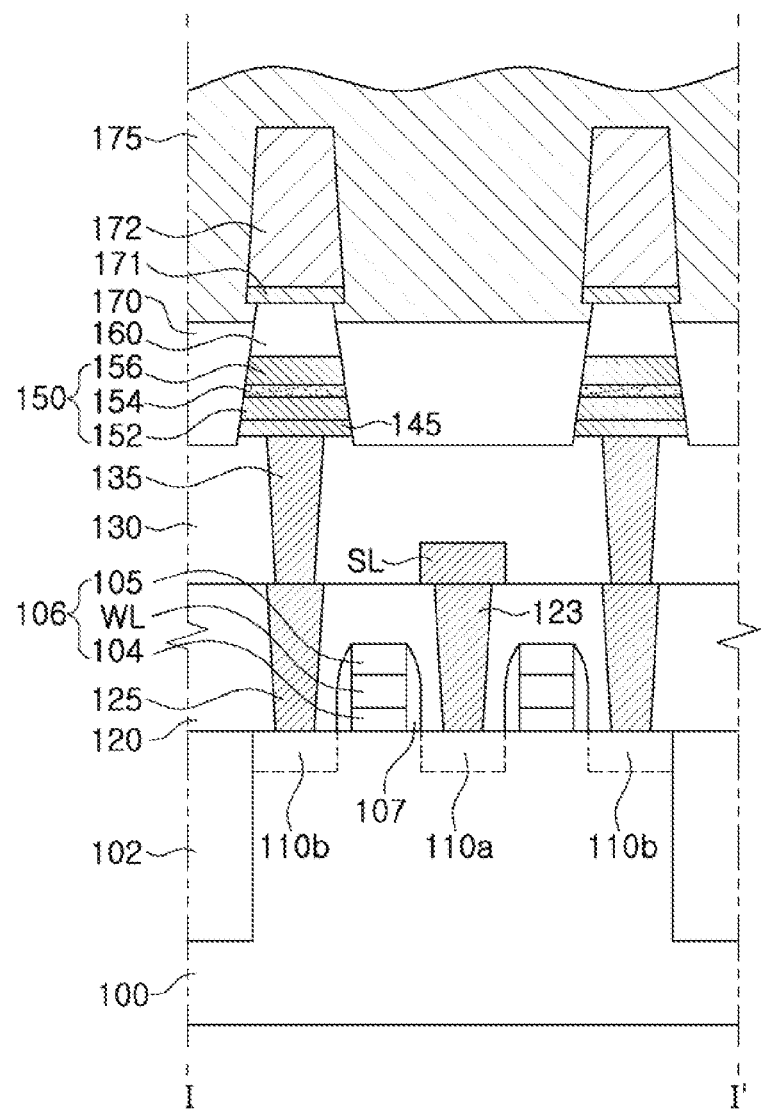

Referring to FIG. 4G, a second insulating layer 175 covering an upper surface of the first insulating layer 170, a partial side surface of the upper electrode 160, a side surface of the SiN pattern 171, and upper and side surfaces of the polymer pattern 172 may be formed.

Figure 4H:
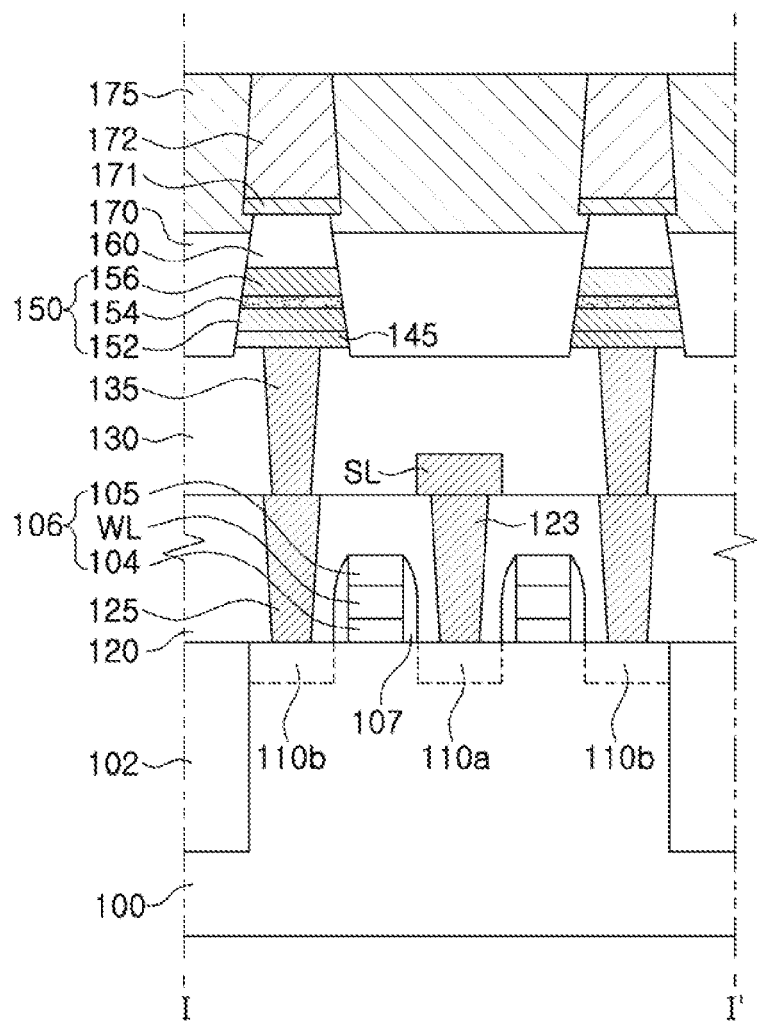

Referring to FIG. 4H, an upper surface of the second insulating layer 175 may be planarized to expose an upper surface of polymer pattern 172. Here, the upper surface of the polymer pattern 172 and the upper surface of the second insulating layer 175 may be coplanar. The planarization process may be performed through an etch-back process.

Figure 4I:
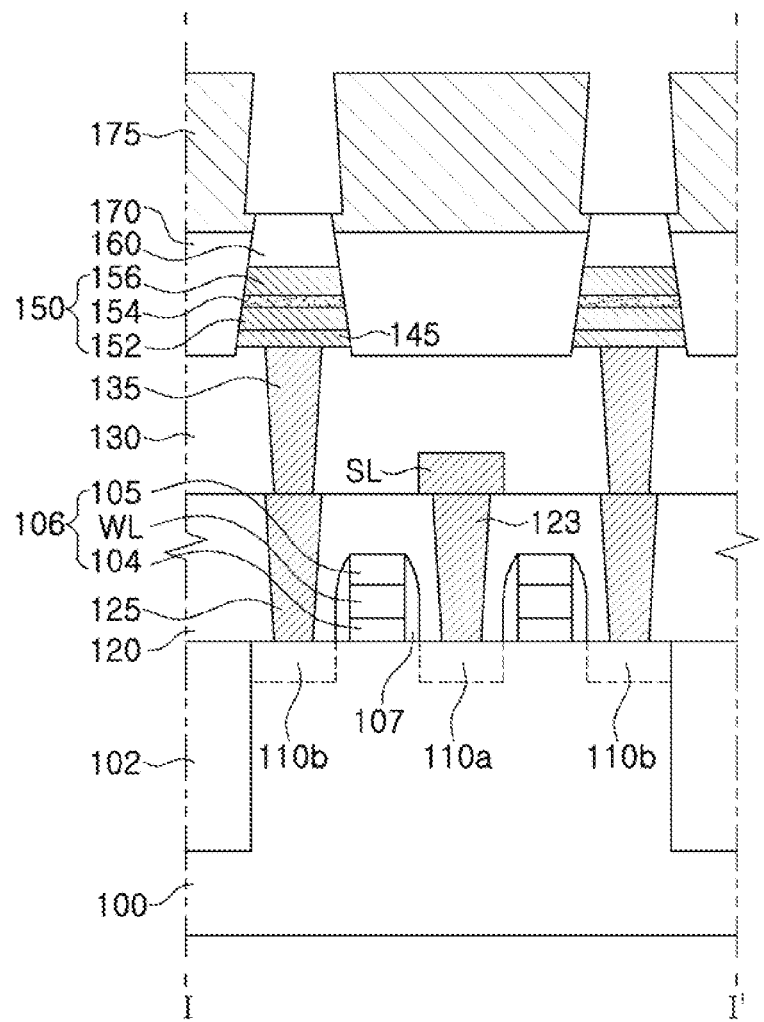

Referring to FIG. 4I, the polymer pattern 175 illustrated in FIG. 4H may be removed through an ashing process. The polymer pattern 175 may be removed by allowing oxygen or a fluorine radical generated due to plasma to decompose an organic compound forming the polymer pattern 172. During the ashing process, only the polymer pattern 172 may be selectively removed, while the second insulting layer 175 may not be removed. The SiN pattern 171 (please refer to FIG. 4H) may be removed through wet etching such that a sub-trench may not be generated on the side surface of the MTJ pattern 150.

Figure 4J:
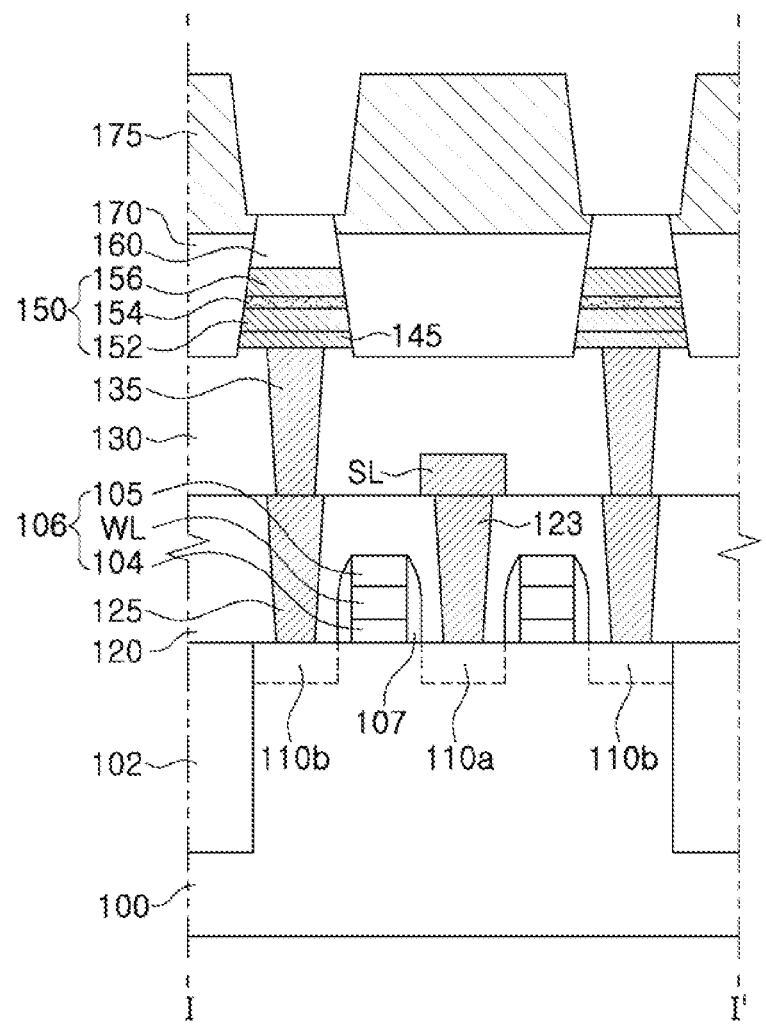

Referring to FIG. 4J, in order to form a metal line serving as the bit line (BL) (please refer to FIG. 3) in the empty space formed as the polymer pattern 172 (please refer to FIG. 4H) was removed, a width of an upper surface of the empty space may be widened by removing the insulating layer partly. In the case that width of the upper surface of the empty space is relatively wide, the empty space may be easily filled with a conductive metal.

If an empty space is formed on the MTJ pattern 150 through dry etching, without filling the empty space generated through the ashing process with a conductive metal, a sub-trench may be generated on a side surface of the MTJ pattern 150 and the sub-trench may expose both the upper magnetic layer 156 and the lower magnetic layer 152. In the case that sub-trench is filled with a conductive metal, the MTJ pattern 150 may be short-circuited. This phenomenon may occur more frequently as the upper electrode 160 is thinner (specifically, when the thickness of the upper electrode 160 is equal to or less than 200A (or about 200 Å)). However, in the case that empty space is formed on the MTJ pattern 150 through an ashing process, a sub-trench may not be generated even though the upper electrode 160 is thin, preventing a short-circuit of the MTJ pattern 150.

Also, in the case that empty space is formed on the MTJ pattern 150 through dry etching, a possibility in which a sub-trench is generated on the side surface of the MTJ pattern 150 increases as the slope of the side surface of the MTJ pattern 150 increases. However, in the case that empty space is formed on the MTJ pattern 150 through the ashing process, even though the side surface of the MTJ pattern 150 is sloped (specifically, when an angle between the side surface of the MTJ pattern 150 and an upper surface of the substrate 100 ranges from 60 degrees to 80 degrees (or, about 60 degrees to about 80 degrees)), a sub-trench is not generated, preventing a short-circuit phenomenon in the MTJ pattern 150.

Figure 5:
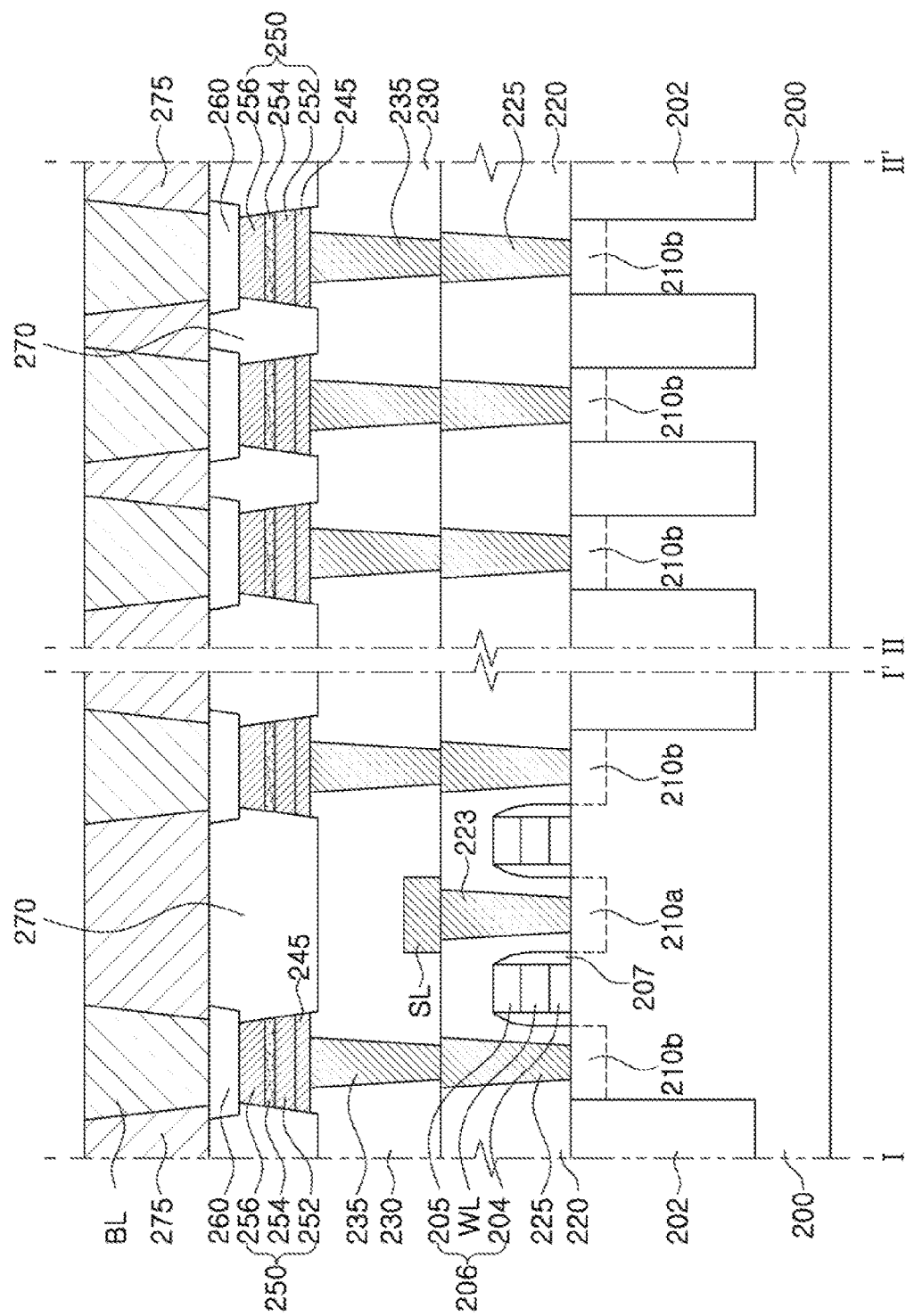

FIG. 5 is a cross-sectional view illustrating a magnetic memory device according to example embodiments of the present inventive concepts, taken along lines I-I' and II-II' of FIG. 2.

Descriptions repeating those for FIGS. 2 and 3 will be omitted for brevity.

Referring to FIGS. 5 and 2, isolation patterns 202 defining active patterns ACT may be formed on a substrate 200. The substrate 200 may be formed of the same material as that of the substrate 100.

The active patterns ACT may be arranged two-dimensionally in a plurality of rows and a plurality of columns, and each of the active patterns ACT may have a rectangular shape (or a bar shape) extending in a diagonal direction with respect to first and second directions D1 and D2 perpendicular to each other. The active patterns ACT may be arranged in the first direction D1 to form each row, and arranged in the second direction D2 to form each column.

A gate 206 including the word line (WL) may be disposed on the substrate 200. The gate 206 includes a gate insulating layer pattern 204, a word line (WL), and a gate mask 205. A spacer 207 may be disposed on side walls of the gate 206.

A first impurity region 210*a* and a second impurity region 210*b* may be formed in regions adjacent to the gate 206 on the substrate 200.

A first interlayer insulating layer 220 may be disposed on the entire surface of the substrate 200. First and second contact plugs 223 and 225 may penetrate through the first interlayer insulating layer 220. Each of the first and second contact plugs 223 and 225 may be electrically connected to the first impurity regions 210*a* and the second impurity regions 210*b*, respectively.

The first and second contact plugs 223 and 225 may be formed of the same material as that of the first and second contact plugs 123 and 125 illustrated in FIG. 3.

Source lines SL extending in the first direction D1 may be disposed on the first interlayer insulating layer 220. The source lines SL may be disposed to traverse the word lines WL. The source lines SL may be connected to the first contact plugs 223 arranged in the first direction D1.

A second interlayer insulating layer 230 may be disposed on the first interlayer insulating layer 220, and the second interlayer insulating layer 230 may cover the second contact plugs 225 and the source lines SL.

Lower contacts 235 may be disposed to penetrate through the second interlayer insulating layer 230, and the lower contacts 235 may be electrically connected to the second contact plugs 225, individually. In example embodiments, the lower contacts 235 may be arranged to be spaced apart from one another in the first direction D1 and the second direction D2 in a planar manner. The lower contacts 235 may be arranged in a zigzag form in the planar manner.

Lower electrodes 245 may be disposed on the lower contacts 135. The lower electrodes 145 may include the same material as that of the lower electrode 145 illustrated in FIG. 3.

An MTJ pattern 250 may be disposed on the lower electrode 235. The MTJ pattern 250 may include a lower magnetic layer 252, a tunnel barrier layer 254 and an upper magnetic layer 256 sequentially disposed on the lower magnetic layer 252.

At least a portion of the lower electrode 245 may be patterned simultaneously when the MTJ pattern 250 is patterned.

In the present example embodiments, a perpendicular magnetic tunnel junction device in which the lower magnetic layer 252 serves as a pinned layer and the upper magnetic layer 256 serves as a free layer will be described as an example, but alternatively, a perpendicular magnetic tunnel junction device in which the lower magnetic layer 252 serves as a free layer and the upper magnetic layer 256 serves as a pinned layer may also be formed.

The lower magnetic layer 252, the tunnel barrier layer 254, and the upper magnetic layer 256 may be formed of the same materials and may have the same structures as those of the lower magnetic layer 152, the tunnel barrier layer 154, and the upper magnetic layer 156 illustrated in FIG. 3.

An upper electrode 260 may be disposed on the MTJ pattern 250. The upper electrode 260 may be formed of the same material as that of the upper electrode 160 illustrated in FIG. 3. A width of a lower surface of the upper electrode 260 may be greater than a width of an upper surface of the MTJ pattern 250, and a lower surface of the upper electrode 260 may cover the entire upper surface of the MTJ pattern 250.

A bit line (BL) 280 may be disposed on the MTJ pattern 250 and formed as a metal line in contact with the upper electrode 260. The bit line (BL) 280 may be formed of a metal having low resistivity, for example, copper (Cu). An upper portion of the bit line (BL) 280 may be greater (or have a greater width) than that of a lower portion thereof.

A first insulating layer 270 covering all the side surfaces of the MTJ pattern 250 and portions of side surfaces of the upper electrode 260 may be disposed on the second interlayer insulating layer 230. An upper surface of the upper electrode 260 may be coplanar with an upper surface of the first insulating layer 270.

A second insulating layer 275 covering all the side surfaces of the bit line (BL) 280 may be disposed on the first insulating layer 270. An upper surface of the second insulating layer 275 and an upper surface of the bit line (BL) 280 may be coplanar.

The first and second interlayer insulating layers 220 and 230 and the first and second insulating layers 270 and 275 may be formed of materials unremovable by an asking process, and may be formed of the same materials as those of the first and second interlayer insulating layers 120 and 130 (please refer to FIG. 3) and the first and second insulating layers 170 and 175 (please refer to FIG. 3).

FIGS. 6A through 6I are cross-sectional views illustrating sequential processes of a method for manufacturing the magnetic memory device illustrated in FIG. 5, taken along line I-I' of FIG. 2.

Figure 6A:
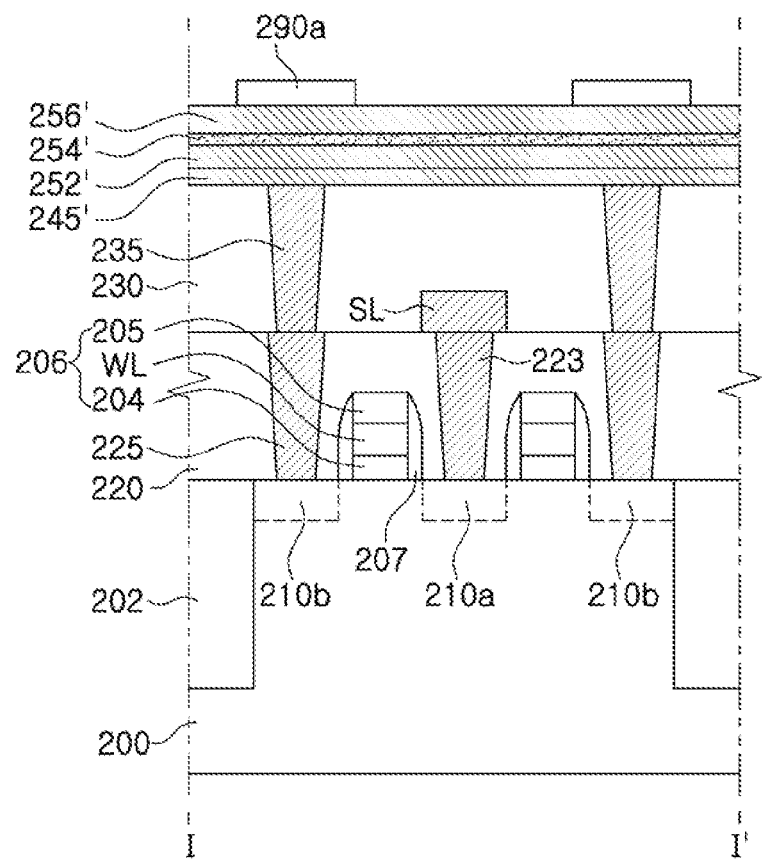
FIGS. 6A through 6I are cross-sectional views illustrating sequential processes of a method for manufacturing a magnetic memory device according to example embodiments of the present inventive concepts, taken along line I-I' of FIG. 2.

Referring to FIG. 6A, the isolation layer 202 is formed on the substrate 200. The isolation layer 202 may be formed through a shallow trench isolation (STI) process.

The gate insulating layer 204, the word line (WL) and the gate mask layer 205 are sequentially disposed on the substrate 200 and patterned though a photolithography process to form gates 206. The gate insulating layer 204 may be formed using a silicon oxide or a metal oxide. The word line (WL) may be formed using a doped polysilicon or metal. The gate mask layer 205 may be formed using a silicon nitride.

Thereafter, the first and second impurity regions 210a and 210b may be formed in regions adjacent to the gates 206 through an ion implantation process using the gates 206 as ion implantation masks. The first and second impurity regions 210a and 210b may serve as source and drain regions of transistors including the gates 206.

The gates 206 and the first and second impurity regions 210a and 210b may constitute a transistor. The spacers 207 may be formed on side walls of the gates 206 using a silicon nitride.

Thereafter, the first interlayer insulating layer 220 covering the gates 206 and the spacers 207 may be formed on the substrate 200. The first interlayer insulating layer 220 may be partially etched to form first holes exposing the impurity regions 210a and 210b.

Thereafter, a first conductive layer filling the first holes is formed on the first interlayer insulating layer 220 and upper portions of the first conductive layer are removed through a chemical mechanical polishing (CMP) and/or an etch-back process until the first interlayer insulating layer 220 is exposed, thereby forming the first contact plug 223 and the second contact plugs 225 in the first holes. The first contact plug 223 may be in contact with the first impurity region 210a, and the second contact plugs 225 may be in contact with the second impurity regions 210b. The first conductive layer may be formed using a doped polysilicon, a metal, and the like. The first contact plug 223 may serve as a source line (SL) contact.

A second conductive layer in contact with the first contact plug 223 may be formed on the first interlayer insulating layer 220 and patterned to form a source line SL. The second conductive layer may be formed using a doped polysilicon, a metal, and the like. Thereafter, the second interlayer insulating layer 230 covering the source line SL may be formed on the first interlayer insulating layer 220. The second interlayer insulating layer 230 is partially etched to form second holes exposing the second contact plugs 225, and a third conductive layer embedding the second holes may be formed on the second contact plugs 225 and the second interlayer insulating layer 230. Upper portions of the third conductive layer are removed through a CMP and/or etch-back process until the second interlayer insulating layer 230 is exposed, thereby forming lower contacts 235 formed within the second holes.

A lower electrode layer 245' may be formed on the second insulating layer 230 and the lower contacts 235. The lower electrode layer 245' may be formed through an atomic layer deposition (ALD) process, a chemical vapor deposition (CVD) process, and the like, using the same material as that of the lower electrode layer 145' (please refer to FIG. 4B). Also, the lower electrode layer 245' may have the same dual-layer structure as that of the lower electrode layer 145' illustrated in FIG. 4B.

A lower magnetic layer 252', a tunnel barrier layer 254', and an upper magnetic layer 256' may be sequentially formed on the lower electrode layer 245'. The lower magnetic layer 252', the tunnel barrier layer 254', and the upper magnetic layer 256' may be formed through a CVD process or an ALD process.

Mask patterns 290a may be formed on the upper magnetic layer 256' such that the mask patterns 290a correspond to the positions of the lower contacts 235. The mask patterns 290a may be formed of the same material as that of the mask patterns 190a illustrated in FIG. 4B.

Figure 6B:
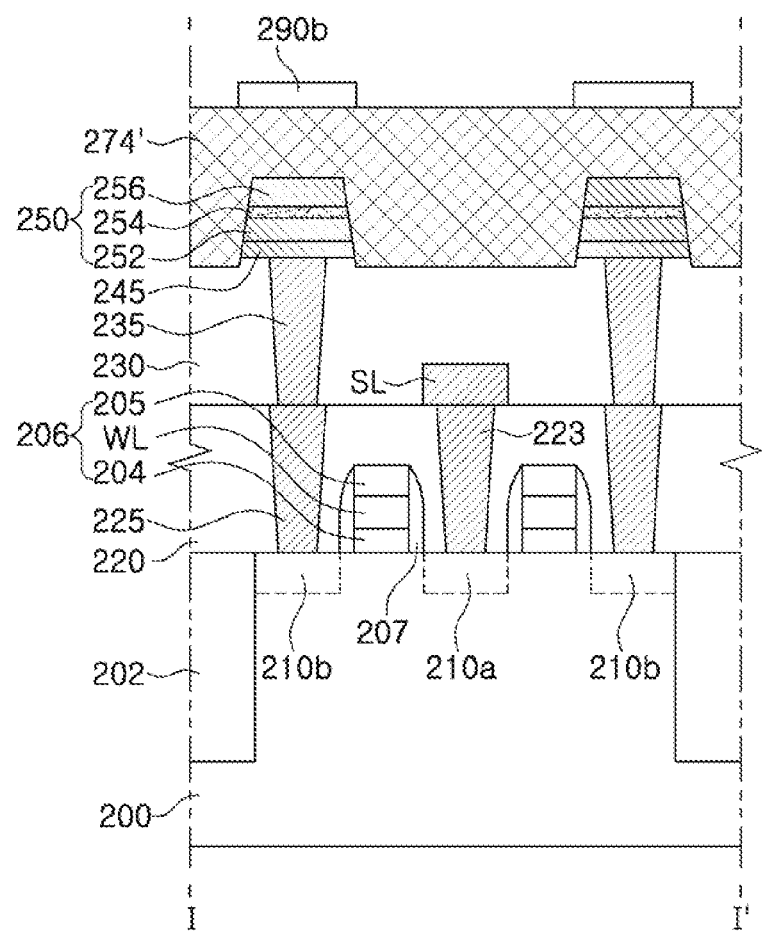

Referring to FIG. 6B, patterning may be performed using the mask patterns 290a illustrated in FIG. 6A as an etching mask to form the MTJ pattern 250 including the lower magnetic layer 252, the tunnel barrier layer 254, and the upper magnetic layer 256. The patterning may be performed through dry etching. After the formation of the MTJ pattern 250, a polymer layer 274' covering the side surfaces of the lower electrode 245 and all of side surfaces and upper surfaces of the MTJ pattern 250 may be formed on the second interlayer insulating layer 230. The polymer layer 274' may be formed of the same material as that of the polymer layer 172' illustrated in FIG. 4E. Mask patterns 290b may be formed on the polymer layer 274', corresponding to the position of the MTJ pattern 250. A width of each mask pattern 290b may be greater than that of an upper surface of the upper magnetic layer 256. The mask patterns 290b may be formed of the same material as that of the mask patterns 190a illustrated in FIG. 4E.

Figure 6C:
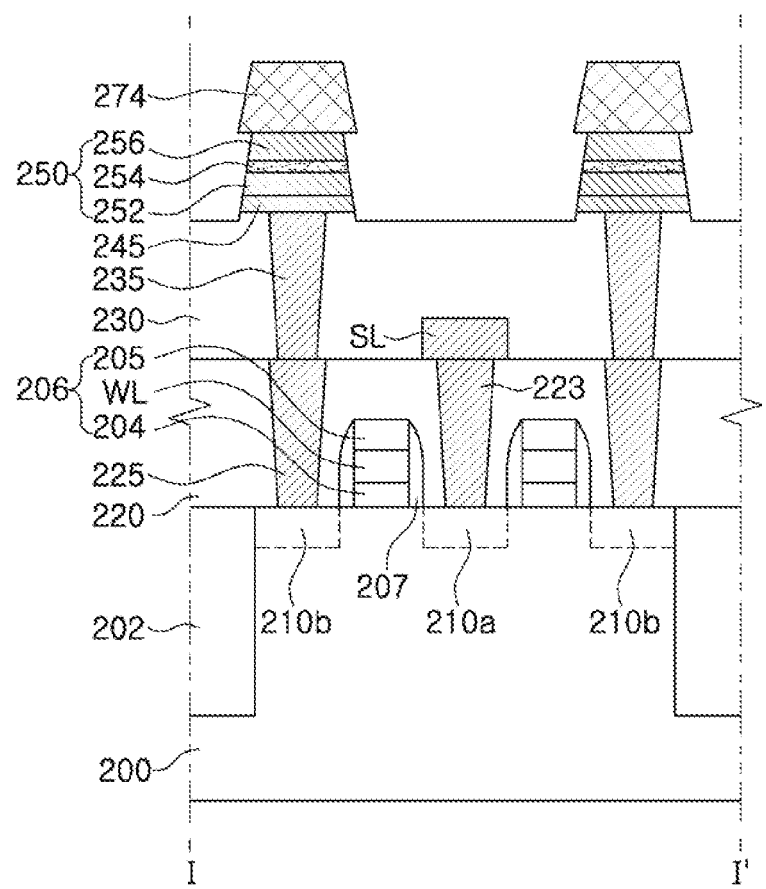

Referring to FIG. 6C, the polymer layer 274' illustrated in FIG. 6B may be patterned using the mask patterns 290b illustrated in FIG. 6B as etching masks to form polymer patterns 274 on the MTJ pattern 250. A width of a lower surface of the polymer pattern 274 may be greater than that of an upper surface of the MTJ pattern 250, and a lower surface of the polymer pattern 274 may cover the entire upper surface of the MTJ pattern 250.

Figure 6D:
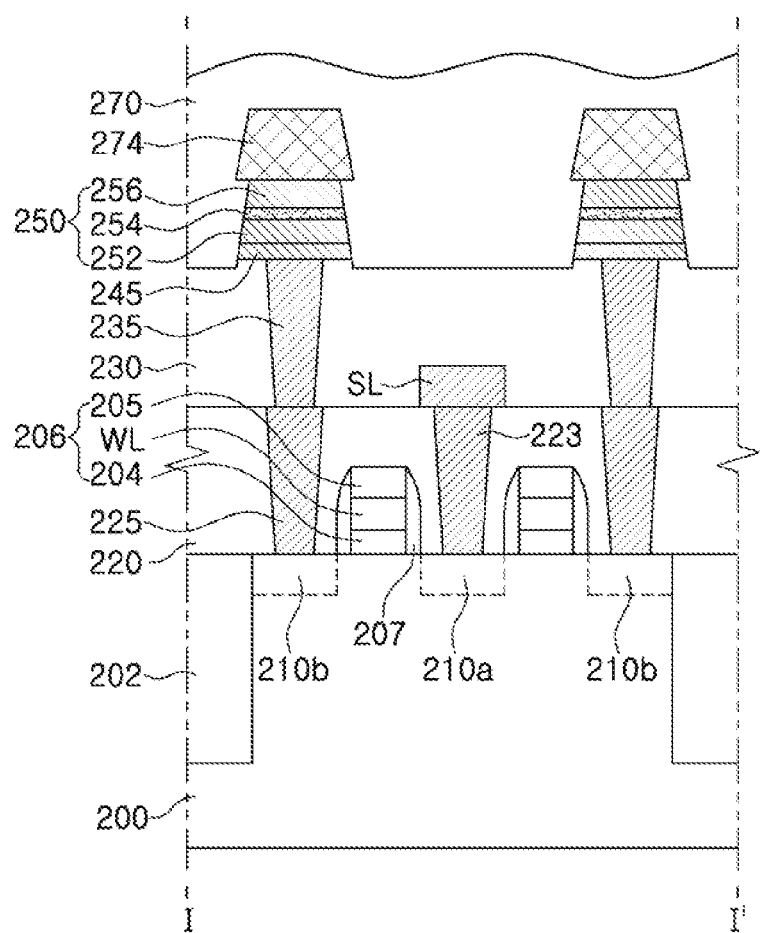

Referring to FIG. 6D, a first insulating layer 270 covering an upper surface of the second interlayer insulating layer 230, all the side surfaces of the MTJ pattern 250, all the side surfaces of the polymer pattern 274, and an upper surface of the polymer pattern 274 may be formed.

Figure 6E:
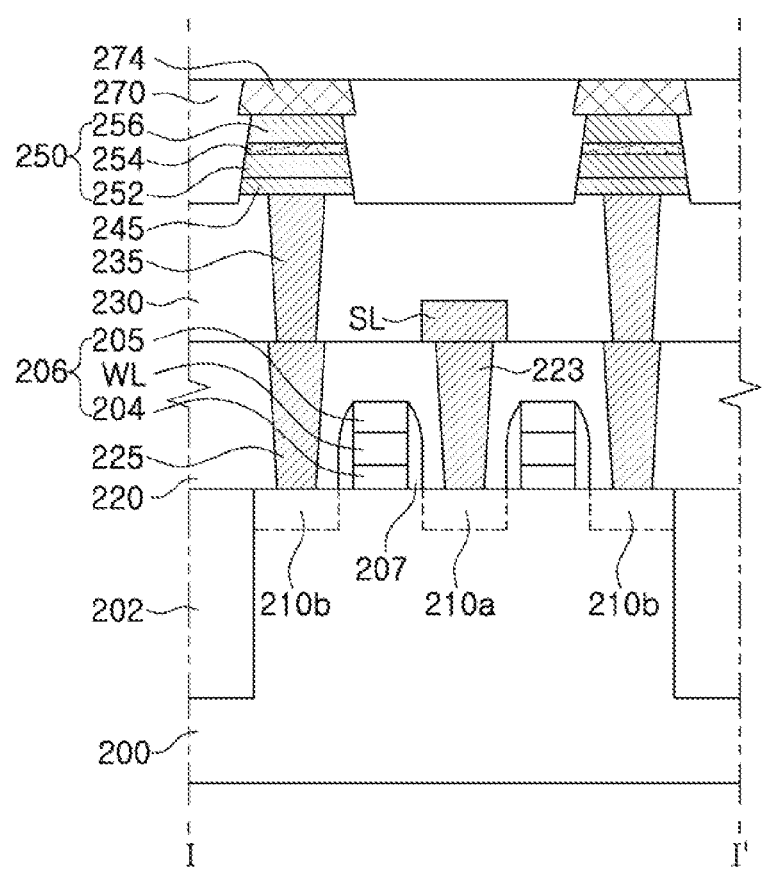

Referring to FIG. 6E, a portion of the upper surface of the first insulting layer 270 may be removed to expose the polymer pattern 274. An upper surface of the polymer pattern 274 and an upper surface of the first insulating layer 270 may be coplanar. The first insulating layer 270 and the polymer pattern 274 may be removed through an etch-back process or a CMP process.

Figure 6F:
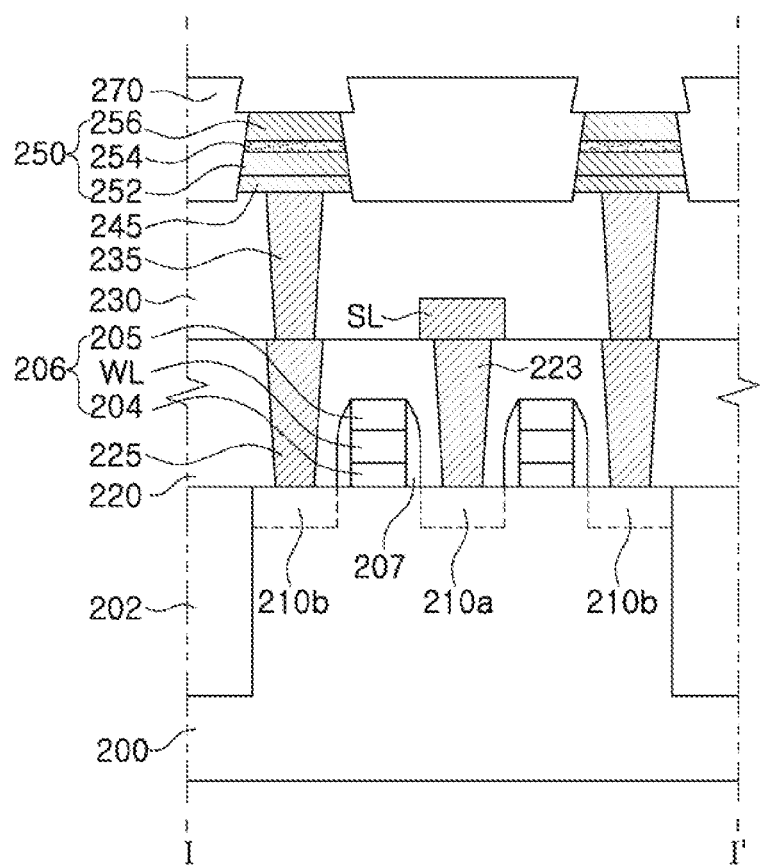

Referring to FIG. 6F, the polymer pattern 274 (please refer to FIG. 6E) may be removed through an ashing process. The ashing process may be removing the polymer pattern 274 (please refer to FIG. 6E) by allowing oxygen or a fluorine radical generated through plasma to decompose an organic compound forming the polymer pattern 274 (please refer to FIG. 6E). During the ashing process, only the polymer pattern 274 (please refer to FIG. 6E) may be selectively removed, while the first insulting layer 270 may not be removed.

Figure 6G:
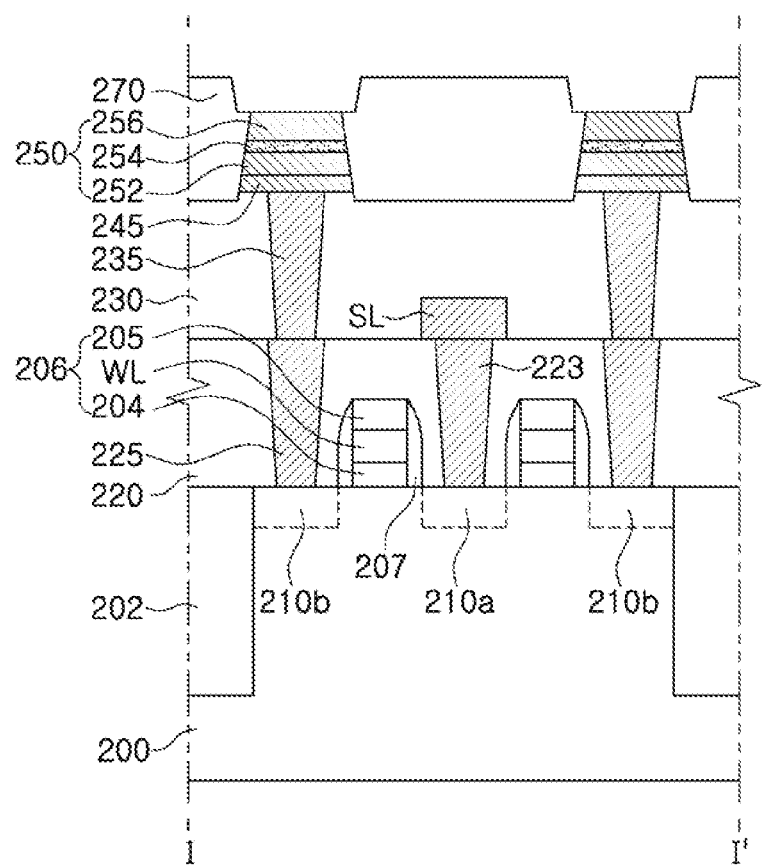

Referring to FIG. 6G, in order to fill the empty space formed by removing the polymer pattern 274 (please refer to FIG. 6E) with a metal forming the upper electrode 260 (please refer to FIG. 5), a width of an upper surface of the empty space may be widened by removing the insulating layer partly. In the case that the width of the upper surface of the empty space is relatively wide, the empty space may be easily filled with a metal.

Figure 6H:
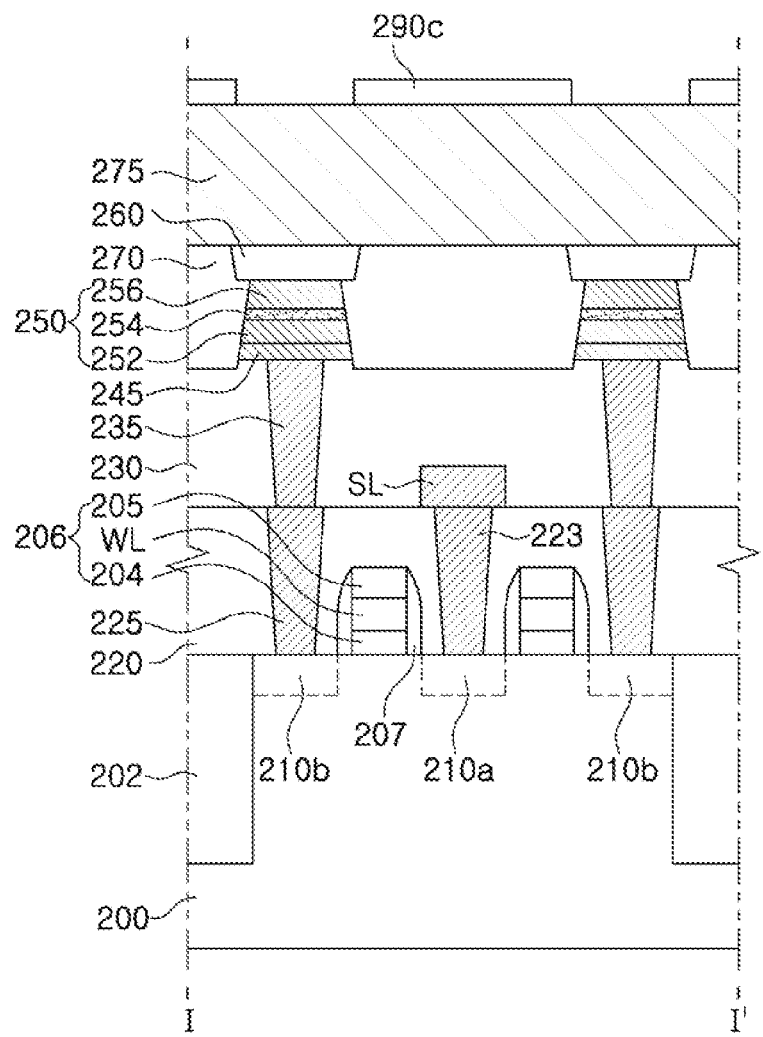

Referring to FIG. 6H, after the empty space formed by removing the polymer pattern 274 (please refer to FIG. 6E) is filled with a metal to form the upper electrode 260, the second insulating layer 275 covering all the upper surfaces of the first insulating layer 270 and the upper electrode 260 may be formed. After the formation of the upper electrode 260, a process of planarizing the upper surface of the upper electrode 260 may be additionally performed such that the upper surface of the upper electrode 260 and the upper surface of the first insulating layer 270 are coplanar, before the second insulating layer 275 is formed. As a result, the upper electrode 260 may be formed to covers an entirety of the MTJ pattern. Mask patterns 290c may be formed on an upper surface of the second insulating layer 275 such that the mask patterns 290c correspond to positions of the upper electrodes 260.

Figure 6I:
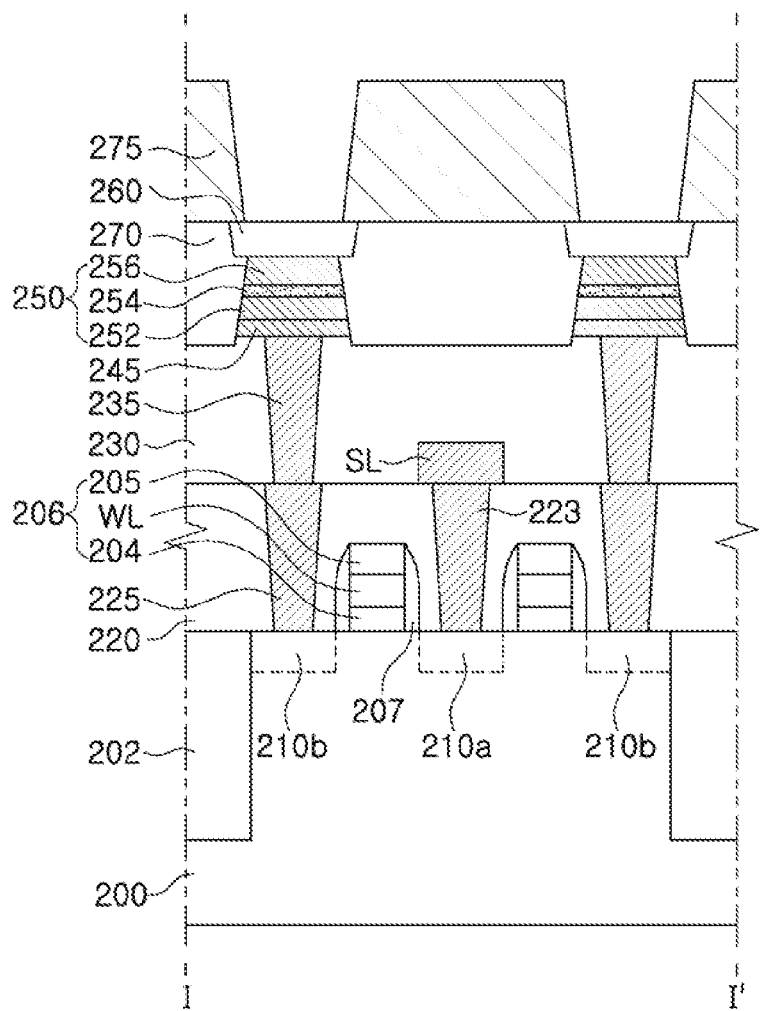

Referring to FIG. 6I, a portion of the second insulating layer 275 may be removed using the mask pattern 290c illustrated in FIG. 6H as an etching mask such that an upper surface of the upper electrode 260 is exposed. The removing may be performed through dry etching.

In the case that a lower surface of the upper electrode 270 does not cover the entire upper surface of the MTJ pattern 250 and a portion of a side surface of the MTJ pattern 250 is exposed, a sub-trench may be generated on the exposed side surface of the MTJ pattern 250 while second insulating layer 275 is being dry-etched. In the case that sub-trench is filled with a conductive metal, the MTJ pattern 250 may be short-circuited. Thus, in the case that second insulating layer 275 is dry-etched, the upper surface of the upper electrode 260 covers the entirety of the MTJ pattern 250 such that the MTJ pattern 250 is not exposed, whereby a sub-trench may not generated on the side surface of the MTJ pattern 250, thus preventing a short-circuit of the MTJ pattern 250.

Figure 7:
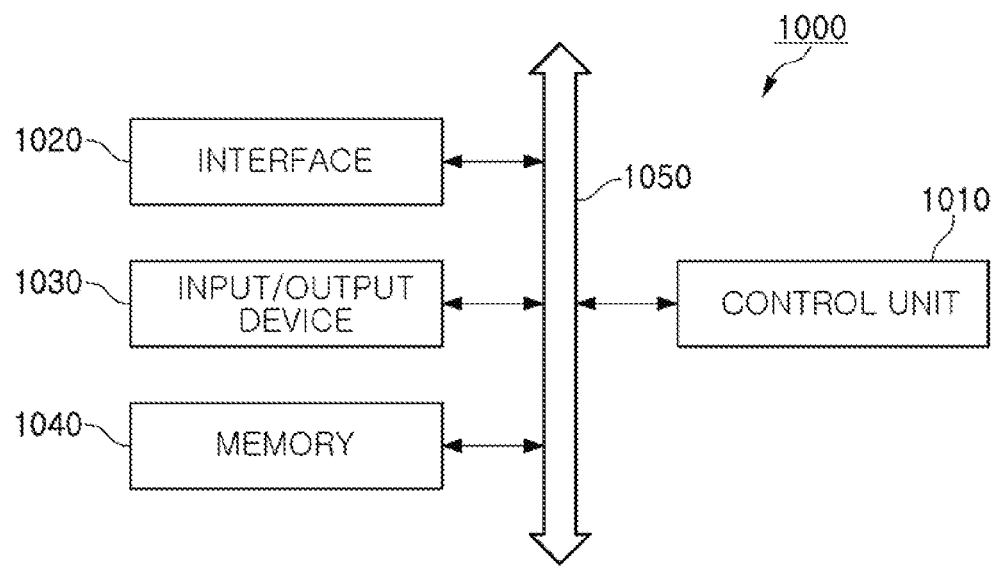
Figure 8:
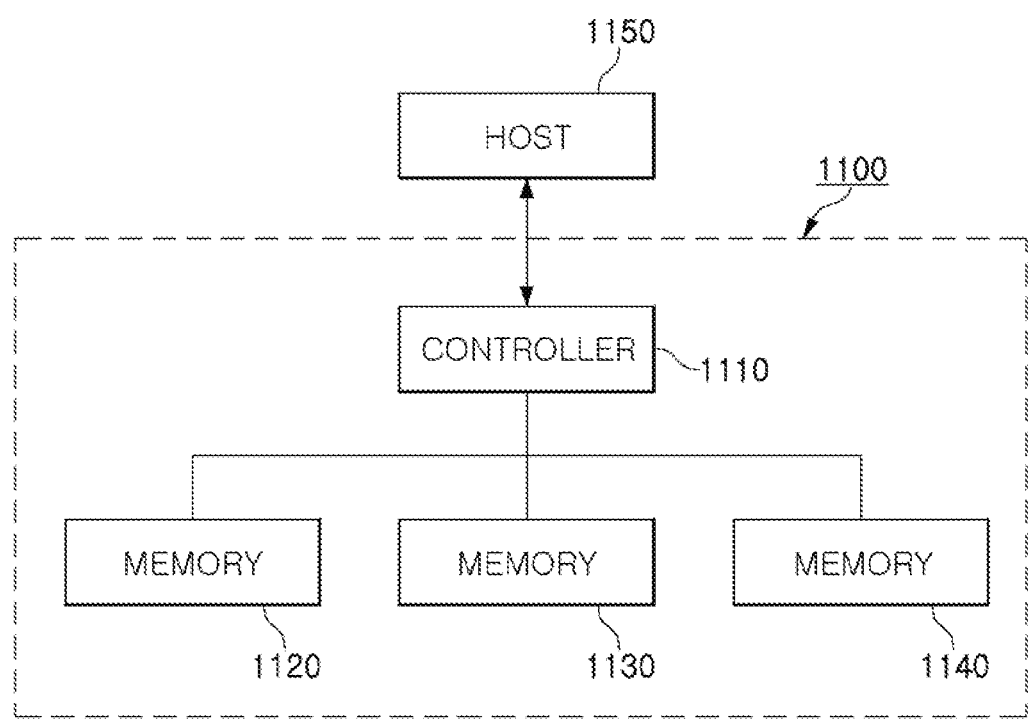

FIGS. 7 and 8 are block diagrams illustrating an electronic device including a magnetic memory device according to example embodiments of the present inventive concepts.

FIG. 7 is a view illustrating an electronic device including a magnetic memory device according to example embodiments of the present inventive concepts.

Referring to FIG. 7, an electronic device 1000 according to the present example embodiments may include a control unit 1010, an interface 1020, an input/output device 1030, a memory 1040, and the like. The control unit 1010, the interface 1020, the input/output device 1030, the memory 1040, and the like, may be connected via a bus (BUS) 1050 providing a passage allowing data to be delivered therethrough.

The control unit 1010 may include a device such as at least one microprocessor, a digital signal processor, a microcontroller, and the like. The memory 1040 may include a device that may read and write data in various manners. The control unit 1010 and the memory 1040 may include any one of the magnetic memory devices according to the example embodiments of the present disclosure described above with reference to FIG. 3 or 5.

The input/output device 1030 may include a keypad, a keyboard, a touch screen device, a display device, an audio input/output module, and the like. The interface 1020 may be a module for transmitting and receiving data via a communications network, and may include an antenna, a wired/wireless transceiver, or the like. In addition to the components illustrated in FIG. 7, the electronic device 1000 may further include an application chip set, an imaging device, and the like. The electronic device 1000 illustrated in FIG. 7 is not limited in terms of category, and may be various devices such as a personal digital assistant (PDA), a portable computer, a mobile phone, a wireless phone, a laptop computer, a memory card, a portable multimedia player, a tablet PC, or the like.

FIG. 8 is a view illustrating a storage device including a magnetic memory device according to example embodiments of the present inventive concepts.

Referring to FIG. 8, an storage device 1100 according to example embodiments may include a controller 1100 communicating with a host 1150 and memories 1120, 1130, and 1140 storing data. The controller 1110 and the memories 1120, 1130, and 1140 may include the magnetic memory devices according to example embodiments described above with reference to FIGS. 1 through 6I.

The host 1150 communicating with the controller 1110 may be various electronic devices in which the storage device 1110 is installed. For example, the host 1150 may be a smartphone, a digital camera, a desktop computer, a laptop computer, a media player, or the like. The controller 1110 may receive a data write or read request delivered from the host 1150 and may store data in the memories 1120, 1130, and 1140, or may generate a command CMD for retrieving data from the memories 1120, 1130, and 1140.

As illustrated in FIG. 8, one or more memories 1120, 1130, and 1140 may be connected to the controller 1110 in parallel within the storage device 1100. By connecting the plurality of memories 1120, 1130, and 1140 to the controller 1110 in parallel, the storage device 1100 having large capacity may be realized.

As set forth above, in the method for manufacturing a magnetic memory device according to example embodiments of the present inventive concepts, a short-circuit phenomenon of the MTJ pattern due to generation of a sub-trench during the process of manufacturing the MTJ pattern may be prevented.

The foregoing is illustrative of example embodiments and is not to be construed as limiting thereof. Although a few example embodiments have been described, those skilled in the art will readily appreciate that many modifications are possible in example embodiments without materially departing from the novel teachings. Accordingly, all such modifications are intended to be included within the scope of the disclosure as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A method of manufacturing a magnetic memory device, the method comprising:
   forming a lower magnetic layer, a tunnel barrier layer, and an upper magnetic layer on a substrate;
   forming a magnetic tunnel junction (MTJ) pattern by patterning the lower magnetic layer, the tunnel barrier layer, and the upper magnetic layer;
   forming a first insulating layer exposing an upper surface of the MTJ pattern;
   forming a polymer pattern on the exposed upper surface of the MTJ pattern;
   forming a second insulating layer exposing an upper surface of the polymer pattern;
   removing the polymer pattern to form a cavity in the second insulating layer, the cavity exposing the upper surface of the MTJ pattern;
   removing a portion of the second insulating layer such that an area of an uppermost portion of the cavity is greater than an area of a lowermost portion of the cavity, after the removing of the polymer pattern; and
   forming a metal line by filling the cavity with a conductive metal.

2. The method of claim 1, wherein the forming of the first insulating layer includes covering side surfaces of the tunnel barrier layer and side surfaces of the lower magnetic layer with the first insulating layer.

3. The method of claim 1, wherein the forming of the polymer pattern includes,
   forming a polymer layer on the exposed upper surface of the MTJ pattern and the first insulating layer;
   forming a mask pattern on an upper surface of the polymer layer; and
   patterning the polymer layer using the mask pattern as a mask.

4. The method of claim 3, further comprising:
   forming a SiN layer on the exposed upper surface of the MTJ pattern and the first insulating layer, before the forming of the polymer layer.

5. The method of claim 1, further comprising:
   performing planarization until an upper surface of the metal line and an upper surface of the second insulating layer are coplanar, after the forming of the metal line.

6. The method of claim 1, wherein the removing of the polymer pattern includes covering side surfaces of the tunnel barrier layer and side surfaces of the lower magnetic layer with the first insulating layer.

7. The method of claim 1, wherein the removing of the polymer pattern includes performing an ashing process.

8. The method of claim 1, wherein the forming of the polymer pattern includes forming a spin-on-hardmask (SOH).

9. The method of claim 1, further comprising:
   providing an upper electrode on the upper magnetic layer.

10. The method of claim 9, wherein a thickness of the upper electrode ranges from 10 Å to 200 Å.

11. The method of claim 1, wherein an angle between a side surface of the MTJ pattern and an upper surface of the substrate ranges from 60 degrees to 80 degrees.

* * * * *